United States Patent
Nonaka et al.

(10) Patent No.: US 9,330,891 B2
(45) Date of Patent: May 3, 2016

(54) PLASMA PROCESSING METHOD AND PLASMA PROCESSING APPARATUS

(71) Applicant: TOKYO ELECTRON LIMITED, Tokyo (JP)

(72) Inventors: Ryo Nonaka, Miyagi (JP); Masanori Sato, Miyagi (JP); Natsuki Yabumoto, Miyagi (JP); Takamitsu Takayama, Miyagi (JP); Akitoshi Harada, Miyagi (JP); Junichi Sasaki, Miyagi (JP); Hidetoshi Hanaoka, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/527,536

(22) Filed: Oct. 29, 2014

(65) Prior Publication Data

US 2015/0114930 A1    Apr. 30, 2015

(30) Foreign Application Priority Data

Oct. 31, 2013 (JP) ................. 2013-227500
Apr. 4, 2014 (JP) ................. 2014-078196
Oct. 15, 2014 (JP) ................. 2014-211142

(51) Int. Cl.
H01J 37/32 (2006.01)
C23C 4/12 (2006.01)
C23C 14/34 (2006.01)
C23F 4/00 (2006.01)
H01J 37/34 (2006.01)

(52) U.S. Cl.
CPC ..... *H01J 37/32715* (2013.01); *H01J 37/32477* (2013.01); *H01J 37/34* (2013.01)

(58) Field of Classification Search
None
See application file for complete search history.

(56) References Cited

U.S. PATENT DOCUMENTS

| 5,812,362 | A | * | 9/1998 | Ravi | H01L 21/6831 279/128 |
| 5,909,354 | A | * | 6/1999 | Harada | B23Q 3/15 279/128 |
| 7,381,673 | B2 | * | 6/2008 | Yokoyama | B32B 18/00 118/500 |
| 9,073,385 | B2 | * | 7/2015 | Okita | H01L 21/67069 |
| 2004/0196613 | A1 | * | 10/2004 | Zheng | H01L 21/68735 361/234 |

(Continued)

FOREIGN PATENT DOCUMENTS

| JP | 2006-210461 A | 8/2006 |
| JP | 2007-67455 A | 3/2007 |
| JP | 2012-109472 A | 6/2012 |

*Primary Examiner* — Allan Olsen
(74) *Attorney, Agent, or Firm* — Rothwell, Figg, Ernst & Manbeck, P.C.

(57) ABSTRACT

A plasma processing method of the present disclosure includes attaching a Si-containing material or a N-containing material to an electrostatic chuck that is provided in a processing container and attached with a reaction product containing C and F, in a state where a workpiece is not mounted on the electrostatic chuck; adsorbing the workpiece by the electrostatic chuck attached with the Si-containing material or the N-containing material when the workpiece is carried into the processing container; processing the workpiece with plasma; and separating the workpiece processed with plasma from the electrostatic chuck attached with the Si-containing material or the N-containing material.

14 Claims, 13 Drawing Sheets

(56) References Cited

U.S. PATENT DOCUMENTS

| | | | | |
|---|---|---|---|---|
| 2006/0008676 A1* | 1/2006 | Ebata | ............... | C04B 41/009 428/698 |
| 2006/0040066 A1* | 2/2006 | Tsutae | ............... | B08B 7/0035 427/569 |
| 2007/0217119 A1* | 9/2007 | Johnson | ............... | H01L 21/6831 361/234 |
| 2008/0276865 A1* | 11/2008 | Nishimizu | ............... | H01L 21/6831 118/500 |
| 2010/0140221 A1* | 6/2010 | Kikuchi | ............... | H01J 37/32091 216/67 |
| 2012/0175063 A1* | 7/2012 | Yamawaku | ............... | H01J 37/32477 156/345.46 |
| 2013/0247935 A1* | 9/2013 | Park | ............... | G03F 7/70925 134/1 |

* cited by examiner (1)

(2)

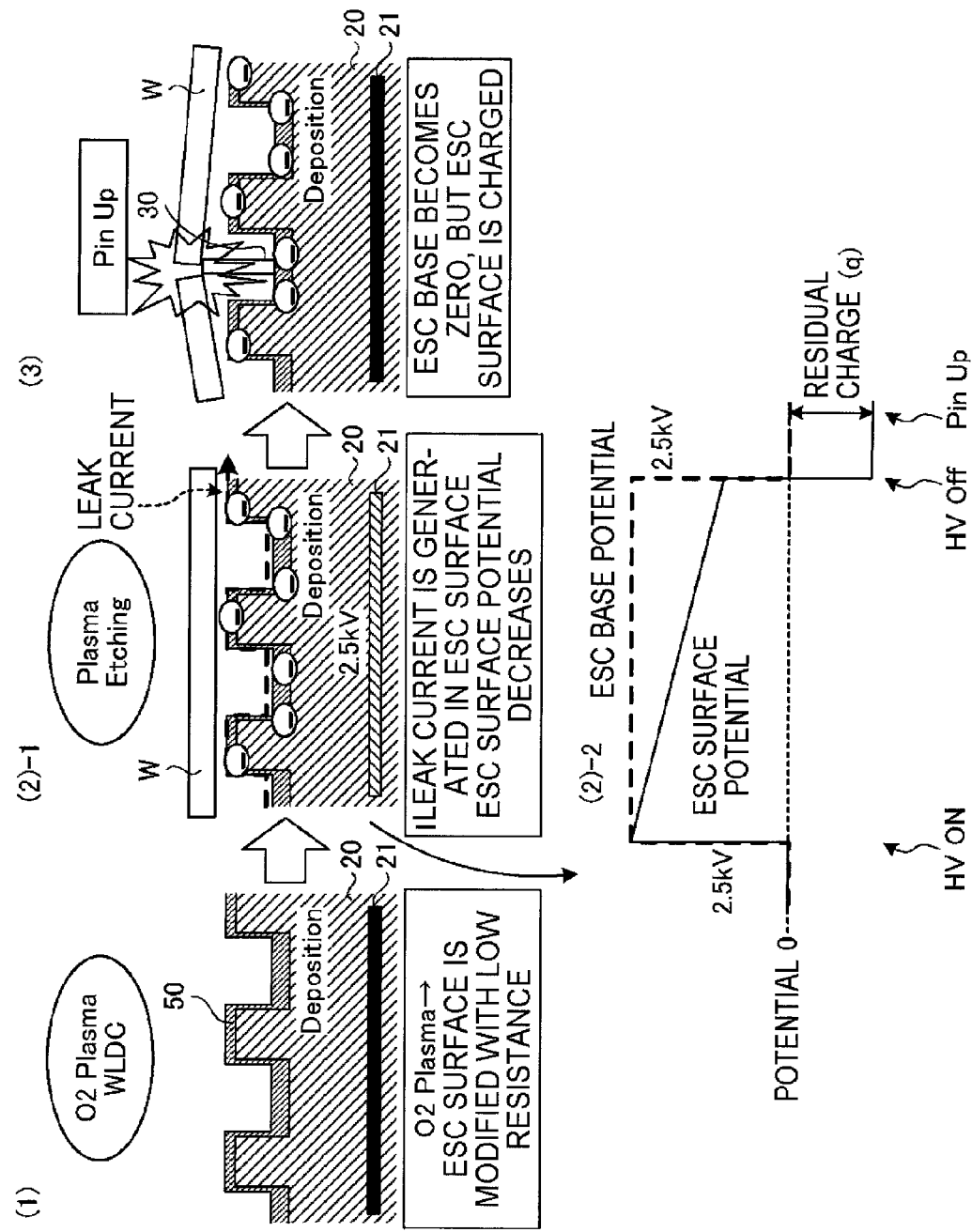

PLASMA PROCESSING METHOD AND PLASMA PROCESSING APPARATUS

CROSS-REFERENCE TO RELATED APPLICATIONS

This application is based on and claims priority from Japanese Patent Application Nos. 2013-227500, 2014-078196 and 2014-211142, filed on Oct. 31, 2013, Apr. 4, 2014, and Oct. 15, 2014, respectively, with the Japan Patent Office, the disclosures of which are incorporated herein in their entireties by reference.

TECHNICAL FIELD

The present disclosure relates to a plasma processing method and a plasma processing apparatus.

BACKGROUND

In the related art, a plasma processing apparatus, for example, adsorbs a workpiece by using an electrostatic chuck installed in a processing container and thereafter, processes the workpiece with plasma, separates the workpiece processed with plasma from the electrostatic chuck, and carries the separated workpiece out of the processing container.

However, in the plasma processing apparatus, the workpiece is processed with plasma, and as a result, an attached matter containing C and F remains in the processing container. As a result, a cleaning processing is performed to remove the attached matter containing C and F, which remains in the processing container. For example, a technology has been known, which separates the workpiece processed with plasma from the electrostatic chuck, carries the workpiece out of the processing container, and thereafter, removes the attached matte in the processing container by plasma of $O_2$-containing gas in a state where the workpiece is not mounted on the electrostatic chuck. See, for example, Japanese Patent Laid-Open Publication No. 2006-210461, Japanese Patent Laid-Open Publication No. 2012-109472 and Japanese Patent Laid-Open Publication No. 2007-67455.

SUMMARY

According to an aspect, the present disclosure provides a plasma processing method including attaching a Si-containing material or a N-containing material to an electrostatic chuck that is provided in a processing container and attached with a Reaction product containing C and F, in a state where a workpiece is not mounted on the electrostatic chuck; adsorbing the workpiece by the electrostatic chuck attached with the Si-containing material or the N-containing material when the workpiece is carried into the processing container; processing the workpiece with plasma; and separating the workpiece processed with plasma from the electrostatic chuck attached with the Si-containing material or the N-containing material.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 12A is a view illustrating a movement of charges in a case where the attachment process is not performed after a cleaning process is performed.

DETAILED DESCRIPTION

Figure 1:
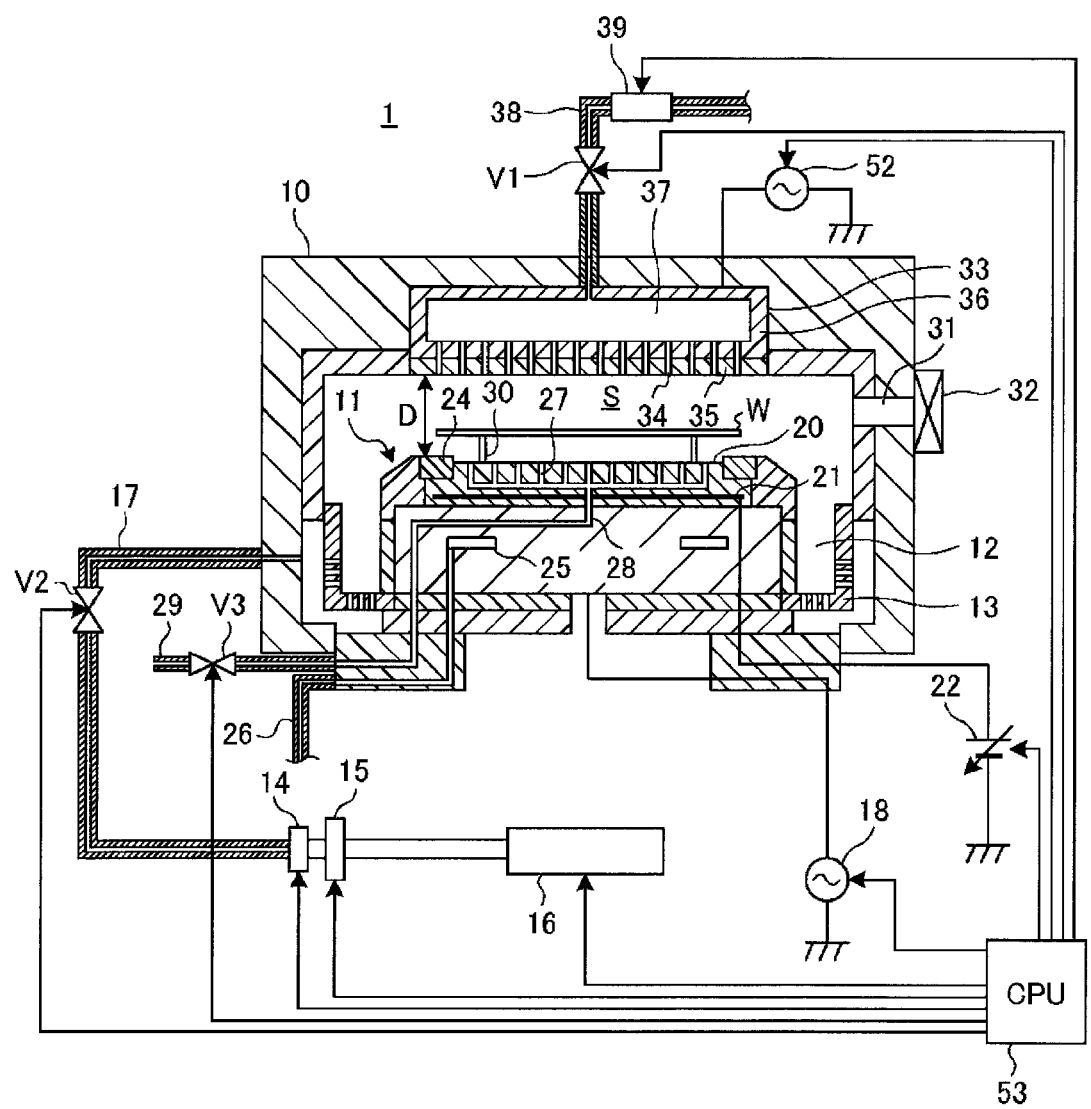
FIG. 1 is a cross-sectional view schematically illustrating a configuration of a plasma processing apparatus to which a plasma processing method is applied according to a first embodiment.

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

In the related art, even reducing residual adsorptive force that disturbs separation of a workpiece is not considered.

That is, in the related art, when the attached matter containing C and F which remains in the processing container is removed as a reaction product containing C and F by the plasma of the $O_2$-containing gas, the reaction product containing C and F of the removed attached matter is diffused to be reattached to the electrostatic chuck. As a result, the plasma processing apparatus adsorbs a new workpiece by using the electrostatic chuck reattached with the reaction product containing C and F to plasma-process the new adsorbed workpiece. Then, electric charges move between the workpiece processed with plasma and the reaction product containing C and F attached to the electrostatic chuck, and as a result, force that pulls the workpiece closer to the electrostatic chuck is generated as the residual adsorptive force. When the residual adsorptive force is generated in the electrostatic chuck, the separation of the workpiece processed with plasma is disturbed and in a worst case, the workpiece may be damaged. In the related art, there is a room for further improvement in terms of reducing the residual adsorptive force that disturbs the separation of the workpiece.

According to various aspects and embodiments of the present disclosure, a plasma processing method and a plasma processing apparatus that can the residual adsorptive force that disturbs the separation of the workpiece are implemented.

Hereinafter, a plasma processing method and a plasma processing apparatus disclosed with reference to the accompanying drawings will be described in detail. Meanwhile, in each drawing, like reference numerals refer to like or corresponding elements.

According to an aspect, the present disclosure provides a plasma processing method including attaching a Si-containing material or a N-containing material to an electrostatic chuck that is provided in a processing container and attached with a Reaction product containing C and F, in a state where a workpiece is not mounted on the electrostatic chuck; adsorbing the workpiece by the electrostatic chuck attached with the Si-containing material or the N-containing material when the workpiece is carried into the processing container; processing the workpiece with plasma; and separating the workpiece processed with plasma from the electrostatic chuck attached with the Si-containing material or the N-containing material.

In the above-mentioned method, in the attaching, the Si-containing material is attached to the electrostatic chuck attached with the reaction product containing C and F by generating plasma of processing gas containing at least any one of Ar, He, $O_2$, and $N_2$ and sputtering a member including Si by ions in the plasma, in a state where the workpiece is not mounted on the electrostatic chuck.

In the above-mentioned method, in the attaching, the N-containing material is attached to the electrostatic chuck attached with the reaction product containing C and F by generating plasma of processing gas containing $N_2$, in a state where the workpiece is not mounted on the electrostatic chuck.

The plasma processing method further includes removing the reaction product containing C and F attached to the electrostatic chuck remaining in the processing chamber by plasma of $O_2$-containing gas, in a state where the workpiece is not mounted on the electrostatic chuck, when the workpiece separated from the electrostatic chuck is carried out of the chamber. In the attaching, the Si-containing material or the N-containing material is attached to the electrostatic chuck attached with the reaction product containing C and F, during a period until the workpiece that is not processed with plasma is carried into the chamber after the reaction product containing C and F attached to the electrostatic chuck is removed by the cleaning.

In the above-mentioned method, after the attaching is performed, whenever the workpiece that is not processed with plasma is carried into the processing container, the adsorbing, the processing, the separating, and the removing are performed, and when the number of performance times of the adsorbing, the plasma-processing, the separating, and the removing reaches a predetermined number of times, a series of processes including re-performing the attaching is repeated.

In the above-mentioned method, a processing time of the attaching is a predetermined time or more.

In the above-mentioned method, the processing time of the attaching is 5 seconds to 60 seconds.

In the above-mentioned method, a high-frequency power used for generating the plasma of the processing gas containing $N_2$ is 400 W to 2,000 W.

In the above-mentioned method, an internal pressure of the processing container is maintained in a range of 6.67 Pa to 107 Pa when the attaching is performed.

According to another aspect, the present disclosure provides a plasma processing apparatus a processing container configured to process a workpiece with plasma; an electrostatic chuck disposed in the processing container and configured to adsorb the workpiece; an exhaust unit configured to decompress an atmosphere in the processing container; a gas supplying unit configured to supply a processing gas to the processing container; and a control unit configured to control a series of processes including attaching a Si-containing material or a N-containing material to an electrostatic chuck attached with a reaction product containing C and F, in a state where a workpiece is not mounted on the electrostatic chuck, adsorbing the workpiece by the electrostatic chuck attached with the Si-containing material or the N-containing material when the workpiece is carried into the processing container, processing the workpiece with plasma, and separating the workpiece processed with plasma from the electrostatic chuck attached with the Si-containing material or the N-containing material.

First Exemplary Embodiment

FIG. 1 is a cross-sectional view schematically illustrating a configuration of a plasma processing apparatus to which a plasma processing method is applied according to a first embodiment.

In FIG. 1, a plasma processing apparatus 1 configured as an etching processing apparatus that etches a wafer W includes a cylindrical chamber (processing chamber) 10 made of metal, for example, aluminum or stainless steel, and a cylindrical susceptor 11 is disposed in the chamber 10. The susceptor 11 configures a lower electrode, and the wafer W, which is a workpiece, is mounted on the susceptor 11.

An exhaust path 12 serving as a path that discharges gas above the susceptor 11 out of the chamber 10 is formed between a side wall of the chamber 10 and the susceptor 11. A circular baffle plate 13 is disposed on the way of the exhaust path 12 and a downstream space of the baffle plate 13 of the exhaust path 12 is in communication with an automatic pressure control valve (hereinafter, referred to as 'APC') 14 which is a variable butterfly valve. The APC 14 is connected to a turbo molecular pump (hereinafter, referred to as 'TMP') 15 which is an exhaust pump for removing vacuum and further, connected to a dry pump (hereinafter, referred to as 'DP') 16 which is a pumping pump through the TMP 15. The exhaust path constituted by the APC 14, the TMP 15, and the DP 16 is hereinafter referred to as 'a main exhaust line', and the main exhaust line controls the pressure in the chamber 10 by the APC 14 and depressurizes an inner part of the chamber 10 until being almost in a vacuum state by the TMP 15 and the DP 16. The APC 14, the TMP 15, and the DP 16 are examples of an exhaust unit for depressurizing the inner part of the chamber 10.

The downstream space of the baffle plate 13 of the exhaust path 12 is connected to a separate exhaust path (hereinafter, referred to as a 'rough exhaust line') from the main exhaust line. The rough exhaust line includes an exhaust pipe 17 having a diameter of, for example, 25 mm, which makes the space and the DP 16 be in communication with each other and a valve V2 disposed on the way of the exhaust pipe 17. The valve V2 may block the communication between the space and the DP 16. The rough exhaust line discharges the gas in the chamber 10 by the DP 16.

A high-frequency power supply 18 that applies predetermined high-frequency power to the susceptor 11 is connected to the susceptor 11. Further, an electrostatic chuck 20 is disposed above the susceptor 11 to adsorb the wafer W with electrostatic adsorptive force. For example, an electrode 21 which is a conductive layer inserted by an insulating layer is installed in the electrostatic chuck 20. A DC power supply 22 is electrically connected to the electrode 21. In the electrostatic chuck 20, the wafer W is adsorbed and held on the top of the susceptor 11 by electrostatic force such as Coulomb force or Johnsen-Rahbek force generated by DC voltage applied to the electrostatic chuck 20 from the DC power supply 22. When the wafer W is not adsorbed, the electrostatic chuck 20 is not conducted with the DC power supply 22 to become in a floating state. Further, an annular focus ring 24 made of silicon (Si) converges plasma generated above the susceptor 11 toward the wafer W.

For example, a circular refrigerant chamber 25 that extends in a circumferential direction is installed in the susceptor 11. Refrigerant having a predetermined temperature, for example, cooling water is circulated and supplied from a chiller unit (not illustrated) through a pipe 26, and as a result, a processing temperature of the wafer W on the susceptor 11 is controlled by the temperature of the refrigerant 25.

A plurality of heat-transfer gas supply holes 27 and heat-transfer gas supply grooves (not illustrated) are disposed in a part (hereinafter, referred to as a 'adsorption surface') on the top of the susceptor 11 to the wafer W is adsorbed. For example, the adsorption surface includes, for example, the top of the electrostatic chuck 20. The heat-transfer gas supply hole 27 and the like are in communication with a heat-transfer gas supply pipe 29 having a valve V3 through a heat-transfer gas supply line 28 disposed in the susceptor 11 to supply heat transfer gas from a heat-transfer gas supplying unit (not illustrated) connected to the heat-transfer gas supply pipe 29, for example, He gas to a gap between the adsorption surface and a rear surface of the wafer W. As a result, heat transference between the wafer W and the susceptor 11 is improved. Meanwhile, the valve V3 may block the heat-transfer gas supply hole 27 and the like and the heat-transfer gas supplying unit.

A plurality of pusher pins 30 as free lift pins that freely protrude on the top of the electrostatic chuck 20 is disposed on the adsorption surface of the susceptor 11. The pusher pins 30 moves vertically in FIG. 1 as a rotary motion of a motor (not illustrated) is converted into a linear motion by a ball screw, and the like. When the wafer W is adsorbed and held on the adsorption surface, the pusher pins 30 are accommodated in the susceptor 11 to be etched, and as a result, when the wafer W which is plasma-processed is carried out of the chamber 10, the pusher pins 30 protrude on the top of the electrostatic chuck 20 to separate the wafer W from the electrostatic chuck 20 and lift the separated wafer W upwards. Further, when the pusher pins 30 separate the wafer W from the electrostatic chuck 20, torque is generated on a rotary shaft of the motor (not illustrated). Hereinafter, when the pusher pins 30 separate the wafer W from the electrostatic chuck 20, the torque generated on the rotary shaft of the motor is called 'pusher pin torque'.

A shower head 33 is disposed on a ceiling portion of the chamber 10. A high-frequency power supply 52 is connected to the shower head 33 and the high-frequency power supply 52 applies predetermined high-frequency power to the shower head 33. As a result, the shower head 33 serves as an upper electrode.

The shower head 33 includes an electrode plate 35 on the bottom, which has a plurality of gas ventilation holes 34 and an electrode support 36 that supports the electrode plate 35 detachably. The electrode support 36 is made of a conductive material, for example, aluminum of which the surface is anodized. The electrode plate 35 is made of a Si-containing material, for example, Si such as silicon single crystal and amorphous silicon. Further, the silicon-containing material may include dopants such as B, As and P to lower a resistivity of the electrode plate.

A buffer chamber 37 is installed in the electrode support 36, and a processing gas inflow pipe 38 from a processing gas supplying unit (not illustrated) is connected to the buffer chamber 37. A valve V1 is disposed on the way of the processing gas inflow pipe 38. The valve V1 may block the buffer chamber 37 and the processing gas supplying unit. Herein, an inter-electrode distance D between the susceptor 11 and the shower head 33 is set to, for example, 27±1 mm or more.

A flow control device 39 that controls a flow of processing gas that flows into the chamber 10 is attached to an upstream side of the valve V1 of the processing gas inflow pipe 38. The flow control device 39 is electrically connected to a central processing unit (CPU) 53 to be described below and controls the flows of the processing gas and purge gas that flow into the chamber 10 based on a signal from the CPU 53.

A gate valve 32 that opens and closes a carry-in/out port 31 of the wafer W is attached to a side wall of the chamber 10. In the chamber 10 of the plasma processing apparatus 1, the high-frequency power is applied to the susceptor 11 and the shower head 33 and high-density plasma is generated from the processing gas in a space S by the applied high-frequency power, and as a result, ions or radicals are generated.

The plasma processing apparatus 1 includes the CPU 53 therein or thereout. The CPU 53 is connected to respective components such as the valves V1, V2, and V3, the APC 14, the TMP 15, the DP 16, the high-frequency power supplies 18 and 52, the flow control device 39, and the DC power supply 22 to control operations of the respective components according to a command by a user's command or a predetermined process recipe. The CPU 53 is one example of a control unit.

For example, the CPU 53 controls each component of the plasma processing apparatus 1 to perform a plasma processing method to be described below. As one detailed example, the CPU 53 sputters a member including Si by ions in plasma by generating plasma of processing gas containing at least one of Ar, He, $O_2$, and $N_2$ to attach the Si-containing material to the electrostatic chuck 20 attached with the reaction product containing C and F. In addition, the CPU 53 adsorbs the workpiece by the electrostatic chuck 20 attached with the Si-containing material to plasma-process the adsorbed workpiece. In addition, the CPU 53 separates the workpiece processed with plasma from the electrostatic chuck 20 attached with the Si-containing material. Herein, the attached matter containing C and F which is attached to the electrostatic chuck 20, for example, the attached matter containing C and F remaining in the chamber 10 is pumped out of the chamber to be removed as the reaction product containing C and F by the plasma of the $O_2$-containing gas. However, some of the reaction product containing C and F are diffused to be attached to the surface of the electrostatic chuck 20. Further, the member including Si constitutes, for example, the shower head 33 as the upper electrode. In addition, the workpiece is, for example, the wafer W.

Figure 2:
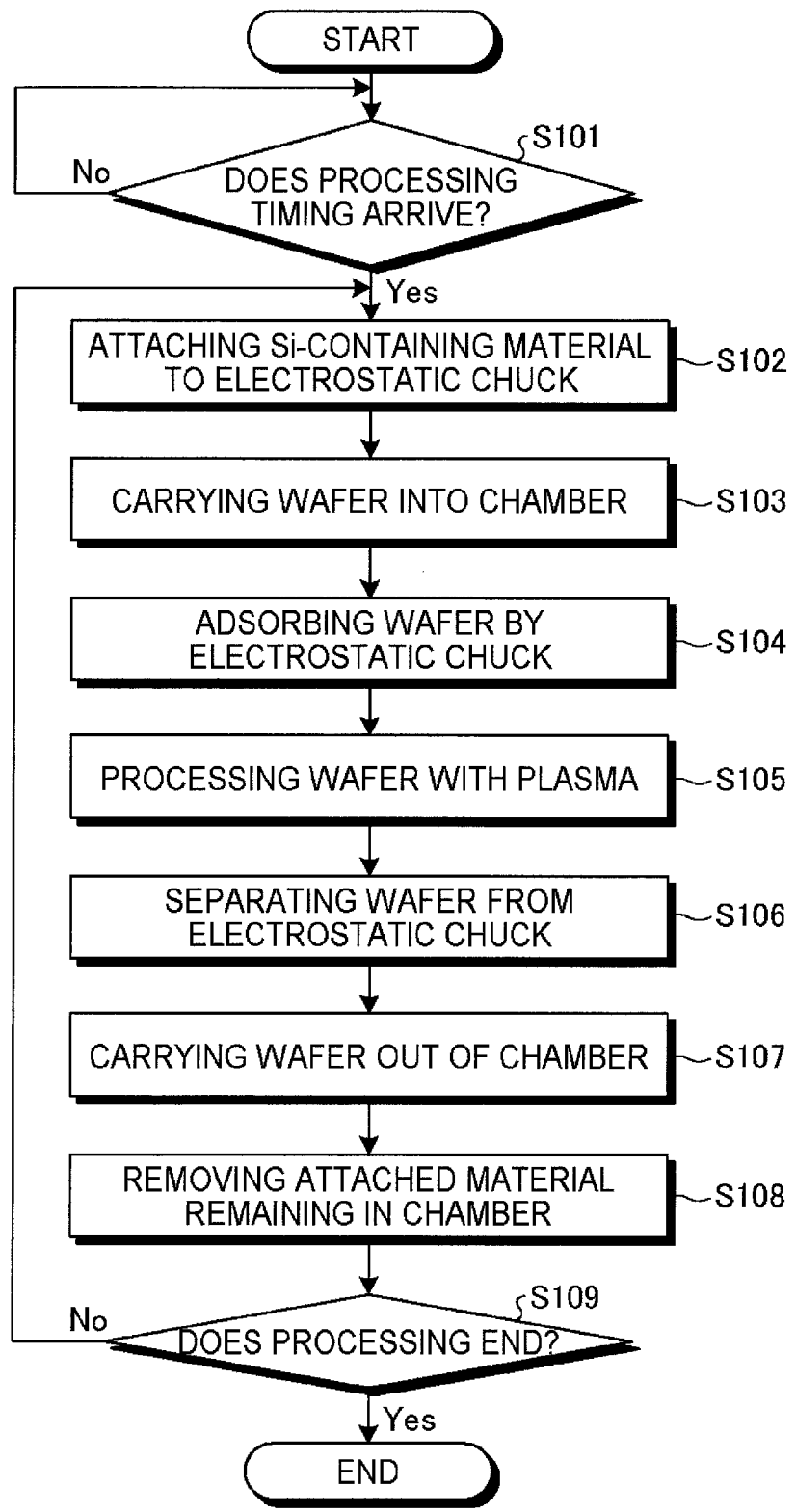
FIG. 2 is a flowchart illustrating an example of a flow of processings of the plasma processing method by the plasma processing apparatus according to the first embodiment.

Subsequently, one example of the flow of the processing of the plasma processing method by the plasma processing apparatus 1 according to the first embodiment will be described. FIG. 2 is a flowchart illustrating one example of a flow of processing of the plasma processing method by the plasma processing apparatus according to the first embodiment. Meanwhile, hereinafter, it is assumed that a cleaning process of removing the attached matter containing C and F, which remains in the chamber 10 by using the plasma of the $O_2$-containing gas is performed at the previous time, and as a result, the reaction product containing C and F is diffused toward the electrostatic chuck 20 to be attached to the surface of the electrostatic chuck 20.

As illustrated in FIG. 2, the plasma processing apparatus 1 stands by until a processing timing arrives (step S101, No). When the processing timing arrives (step S101, Yes) (step S102), the plasma processing apparatus 1 performs the attached matter process of attaching the Si-containing material to the electrostatic chuck 20 by generating the plasma of the processing gas and sputtering the shower head 33 including Si by ions in the plasma while the workpiece is not mounted on the electrostatic chuck 20. In detail, the plasma processing apparatus 1 attaches the Si-containing material to the electrostatic chuck 20 attached with the reaction product containing C and F, during a period until the wafer W which is not plasma-processed is carried into the chamber 10 after the attached matter containing C and F which remains in the chamber 10 is removed, by the cleaning process at the previous time. For example, the plasma processing apparatus 1 attaches the Si-containing material by using the processing gas containing at least one of Ar, He, $O_2$, and $N_2$. Further, a processing time of the attached matter process is preferably a predetermined time or more, for example, preferably 10 seconds or more and more preferably 20 seconds or more. When the processing time of the attachment process is equal to or less than 10 seconds, attachment of the Si-containing material is insufficient because the generation of plasma becomes unstable, and as a result, the residual adsorptive force remains.

Figure 3:
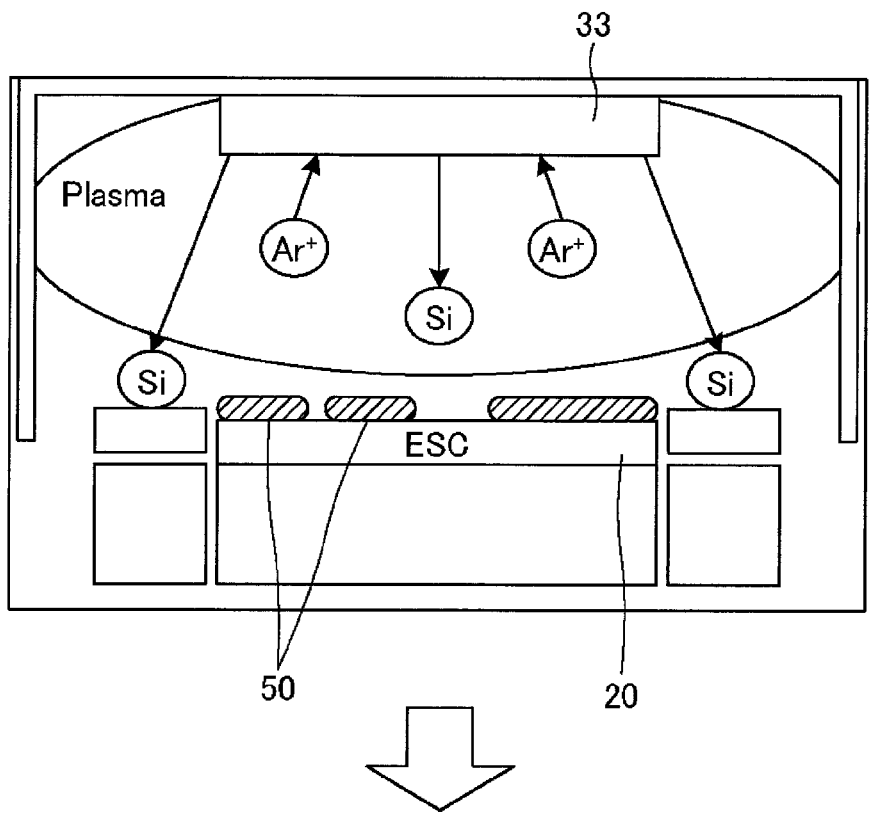
FIG. 3 is a diagram illustrating an attachment process in the first embodiment.
Figure 3:
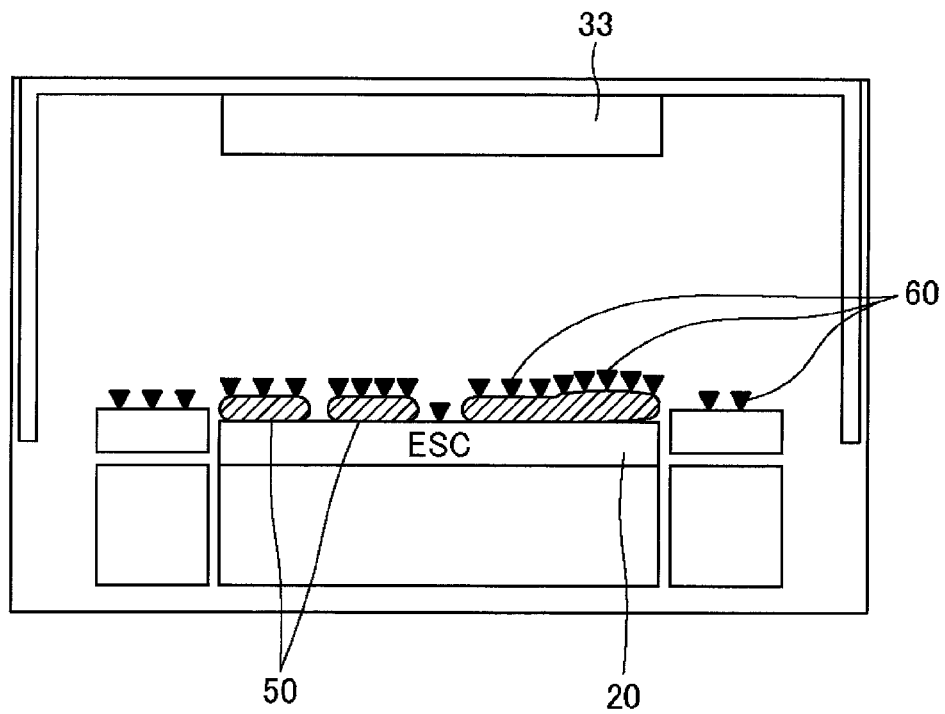

FIG. 3 is a diagram illustrating an attachment process in the first embodiment. In an example of FIG. 3, it is assumed that a reaction product 50 containing C and F is attached to the electrostatic chuck 20. The CPU 53 of the plasma processing apparatus 1 supplies the processing gas containing at least one of Ar, He, $O_2$, and $N_2$ into the chamber 10 from the shower head 33 and applies high-frequency power for generating plasma to the shower head 52 from the high-frequency power supply 52. In this case, the CPU 53 does not apply high-frequency power for injecting ions from the high-frequency power supply 18. That is, as illustrated in FIG. 3(1), the CPU 53 applies the high-frequency power for generating plasma to the shower head 33 from the high-frequency power supply 52, so that magnetic bias voltage Vdc on the surface of the electrode plate 35 is deepened enough to acquire a predetermined sputter effect for the surface of the shower head 33, that is, an absolute value of Vdc on the surface of the shower head 33 increases, when the plasma of the processing gas containing at least one of Ar, He, $O_2$, and $N_2$ is generated. Thereafter, the CPU 53 supplies, to the chamber 10, the processing gas containing at least one of Ar, He, $O_2$, and $N_2$.

As a result, as illustrated in FIG. 3(1), a collision of ions with the surface of the electrode plate 35 of the shower head 33 is accelerated, and as a result, the shower head 33 is sputtered and a drop amount (sputtered amount) of Si included in the electrode plate 35 constituting the shower head 33 increases. For example, in an example illustrated in FIG. 3(1), the Ar ion in the plasma collides with the surface of the electrode plate 35, and as a result, Si forming the electrode plate 35 is deposited toward the electrostatic chuck 20. Then, as illustrated in FIG. 3(2), a Si-containing material 60 is deposited on the surface of the electrostatic chuck 20 attached with the reaction product 50 containing C and F. As a result, the reaction product 50 attached on the electrostatic chuck 20 is covered by the Si-containing material together with the electrostatic chuck 20. In other words, movement of electric charges between the wafer W adsorbed by the electrostatic chuck 20 and the reaction product 50 attached on the electrostatic chuck 20 is blocked by the Si-containing material 60. As a result, the residual adsorptive force that disturbs the separation of the wafer W from the electrostatic chuck 20 may be reduced.

Meanwhile, in the example of FIG. 3, an example in which the CPU 53 does not apply the high-frequency power for injecting ions from the high-frequency power supply 18 is illustrated, but the present disclosure is not limited thereto, and the CPU 53 may apply the high-frequency power for injecting ions from the high-frequency power supply 18. Further, in the example of FIG. 3, the example in which the high-frequency power for generating plasma is applied to the shower head 33 from the high-frequency power supply 52 is illustrated, but the present disclosure is not limited thereto, and negative DC voltage is supplied to the shower head 33 from a DC power supply (not illustrated) to sputter the shower head 33.

The description of FIG. 2 is returned. Subsequently, the plasma processing apparatus 1 performs a carry-in process of carrying the workpiece into the chamber 10 (step S103).

A more detailed example will be described. The CPU 53 of the plasma processing apparatus 1 carries the wafer W into the chamber 10 from the gate valve 32 and the carry-in/out port 31 and mounts the carried-in wafer W on the electrostatic chuck 20.

Subsequently, the plasma processing apparatus 1 performs an adsorption process of adsorbing the workpiece by the electrostatic chuck 20 attached with the Si-containing material (step S104).

A more detailed example will be described. The CPU 53 of the plasma processing apparatus 1 applies the DC voltage to the electrode plate 35 of the electrostatic chuck 20 from the DC power supply 22 to adsorb the wafer W onto the susceptor 11.

Subsequently, the plasma processing apparatus 1 performs a plasma processing process of plasma-processing the workpiece by the plasma of the processing gas (step S105). For example, the plasma processing apparatus 1 plasma-processes the wafer W adsorbed by the electrostatic chuck 20 by using the processing gas, for example, CF based gas. Then, the wafer W is plasma-processed, and as a result, the reaction product containing C and F is attached to an inner wall of the chamber 10 or the shower head 33 in the chamber 10. That is, the reaction product containing C and F remains in the chamber 10.

A more detailed example will be described. The CPU 53 of the plasma processing apparatus 1 supplies the processing gas into the chamber 10 from the shower head 33 to apply the high-frequency power for generating plasma to the shower head 33 from the high-frequency power supply 52 and simultaneously apply the high-frequency power for injecting ions to the susceptor 11 from the high-frequency power supply 18. As a result, the wafer W is plasma-processed.

Subsequently, the plasma processing apparatus 1 performs a separation process of separating the workpiece processed with plasma from the electrostatic chuck 20 attached with the Si-containing material (step S106).

A more detailed example will be described. The CPU 53 of the plasma processing apparatus 1 stops applying the DC voltage to the electrode plate 35 of the electrostatic chuck 20 and simultaneously makes the pusher pins 30 protrude from the electrostatic chuck 20 to separate the wafer W from the electrostatic chuck 20.

Subsequently, the plasma processing apparatus 1 performs a carry-out process of carrying the workpiece out of the chamber 10 (step S107).

A more detailed example will be described. The CPU 53 of the plasma processing apparatus 1 carries the wafer W separated from the electrostatic chuck 20 out of the chamber 10 through the carry-in/out port 31 and the gate valve 32.

Subsequently, the plasma processing apparatus 1 performs a cleaning process of removing the attached matter containing C and F which remains in the chamber 10 (on the sidewall of the chamber or around the susceptor) by the plasma of the $O_2$-containing gas, while the workpiece is not mounted on the electrostatic chuck 20, when the workpiece is carried out of the chamber 10 (step S108). For example, the plasma processing apparatus 1 removes the attached matter containing C and F as the reaction product containing C and F, by using $O_2$ as the $O_2$-containing gas. Then, the removed attached matter containing C and F as the reaction product containing C and F is diffused toward the electrostatic chuck 20, and a part thereof is attached to the surface of the electrostatic chuck 20.

A more detailed example will be described. The CPU 53 of the plasma processing apparatus 1 supplies $O_2$ into the chamber 10 from the shower head 33, applies the high-frequency power for generating plasma to the shower head 33 from the high-frequency power supply 52, and simultaneously applies the high-frequency power for injecting ions to the susceptor 11 from the high-frequency power supply 18. As a result, the attached matter containing C and F is removed as the reaction product containing C and F by plasma of $O_2$, and is diffused toward the electrostatic chuck 20 as the reaction product containing C and F to be attached to the surface of the electrostatic chuck 20.

Subsequently, the plasma processing apparatus 1 determines whether the processing is ended (step S109). The plasma processing apparatus 1 returns the processing to step S102 and repeats steps S102 to S109 when the processing is continued (step S109, No). Meanwhile, the plasma processing apparatus 1 ends the processing when the processing is ended (step S109, Yes). Further, in a case where the attachment process (step S102) is performed in every wafer processing, the process of determining whether the processing is ended (step S109) may be omitted.

Meanwhile, in the example illustrated in FIG. 2, it is presumed that the cleaning process is performed at the previous time, and as a result, the reaction product containing C and F is diffused to the electrostatic chuck 20 to be attached to the surface of the electrostatic chuck 20, but the present disclosure is not limited thereto. For example, as necessary, the cleaning process of step S108 may be omitted. In this case, the plasma processing process of step S105 is performed at the previous time, and as a result, the reaction product containing C and F is attached to the surface of the electrostatic chuck 20. Therefore, the reaction product containing C and F remains on the surface of the electrostatic chuck 20. For example, the reaction product containing C and F, which is not pumped when the plasma processing process is performed at the previous time, is attached to the surface of the electrostatic chuck 20. In the first embodiment, although the cleaning process of step S108 is omitted, the attachment process of step S102 is performed, and as a result, the reaction product attached to the electrostatic chuck 20 may be covered by the Si-containing material together with the electrostatic chuck 20. In other words, movement of electric charges between the wafer W adsorbed by the electrostatic chuck 20 and the reaction product attached to the electrostatic chuck 20 is blocked by the Si-containing material. As a result, the residual adsorptive force that disturbs the separation of the wafer W from the electrostatic chuck 20 may be reduced.

As described above, the plasma processing apparatus 1 of the first embodiment performs an attachment process of attaching the Si-containing material to the electrostatic chuck 20 attached with the attached matter or the reaction product containing C and F by generating the plasma of the processing gas containing at least one of Ar, He, $O_2$, and $N_2$ and sputtering the electrode plate 35 constituting the shower head 33 including Si by the ions in the plasma. In addition, the plasma processing apparatus 1 performs an adsorption process of adsorbing the workpiece by the electrostatic chuck 20 attached with the Si-containing material. In addition, the plasma processing apparatus 1 performs a plasma processing process of plasma-processing the workpiece. In addition, the plasma processing apparatus 1 performs a separation process of separating the workpiece processed with plasma from the electrostatic chuck 20 attached with the Si-containing material. As a result, the attached matter or the reaction product attached to the electrostatic chuck 20 is covered by the Si-containing material together with the electrostatic chuck 20 and thereafter, the workpiece may be adsorbed by the electrostatic chuck 20. In other words, movement of electric charges between the wafer W adsorbed by the electrostatic chuck 20 and the attached matter or the reaction product attached to the electrostatic chuck 20 is blocked by the Si-containing material. As a result, the residual adsorptive force that disturbs the separation of the wafer W from the electrostatic chuck 20 may be reduced.

Figure 4A:
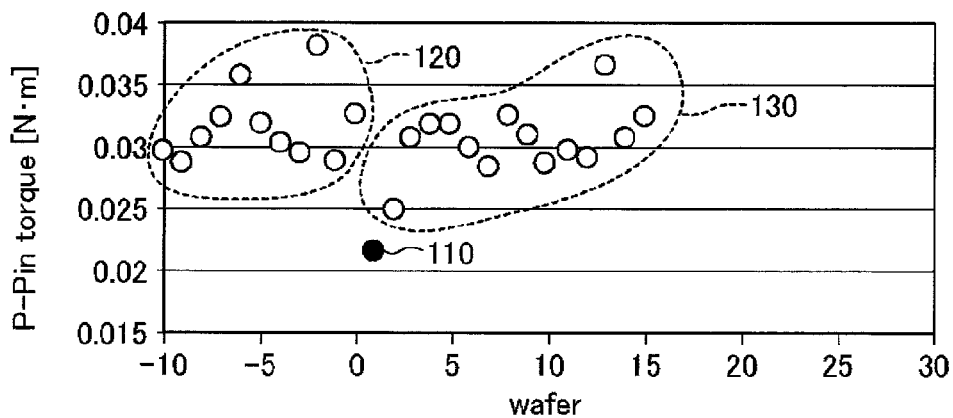
FIG. 4A is an explanatory diagram for describing a meaning of implementing the attachment process in the first embodiment.
Figure 4B:
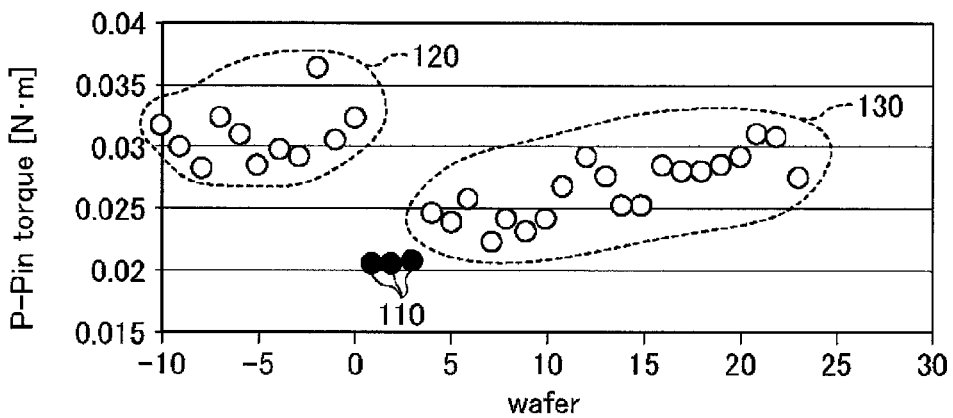
FIG. 4B is an explanatory diagram for describing a meaning of implementing the attachment process in the first embodiment.
Figure 4C:
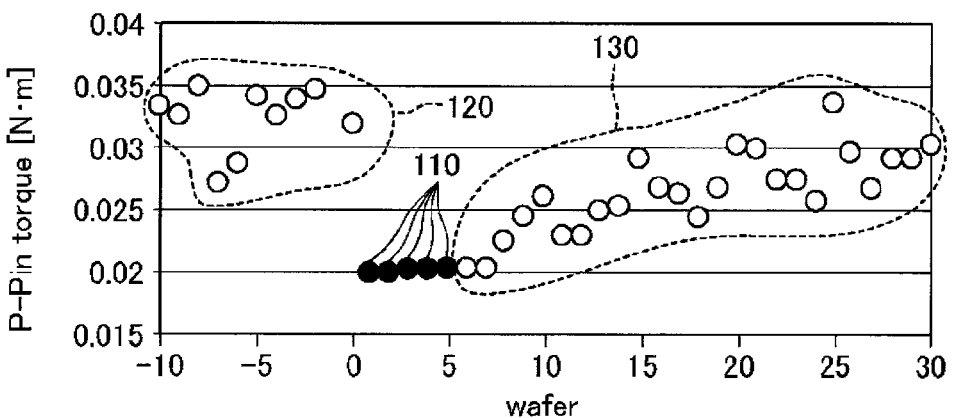
FIG. 4C is an explanatory diagram for describing a meaning of implementing the attachment process in the first embodiment.

Subsequently, the attachment process in the first embodiment will be described in more detail. FIGS. 4A to 4C are explanatory diagrams for describing a meaning of implementing the attachment process in the first embodiment. In FIGS. 4A to 4C, a longitudinal axis represents torque (that is, pusher pin torque) (N·M) generated by a rotary shaft of a motor when the pusher pins 30 separate the wafer W from the electrostatic chuck 20, and a transverse axis represents a lot number of the wafer W which is a measurement object of the pusher pin torque.

In FIGS. 4A to 4C, a measurement point 110 represents pusher pin torque acquired when the attachment process, the carry-in process, the adsorption process, the plasma processing process, the separation process, the carry-out process, and the cleaning process are sequentially performed. In addition, in FIGS. 4A to 4C, a measurement point group 120 represents pusher pin torque acquired when other processes except for the attachment process are sequentially performed without performing the attachment process before the attachment process, the carry-in process, the adsorption process, the plasma processing process, the separation process, the carry-out process, and the cleaning process are sequentially performed. Moreover, in FIGS. 4A to 4C, a measurement point group 130 represents pusher pin torque acquired when other processes except for the attachment process are sequentially performed without performing the attachment process after the attachment process, the carry-in process, the adsorption process, the plasma processing process, the separation process, the carry-out process, and the cleaning process are sequentially performed. Besides, example, in the attachment process, the attachment process is performed under conditions including pressure: 3.99 Pa (30 mTorr), high-frequency power HF/low-frequency power LF: 500/100 W, processing gas: Ar=1200 sccm, and processing time: 20 seconds.

As illustrated in FIGS. 4A to 4C, when the attachment process, the carry-in process, the adsorption process, the plasma processing process, the separation process, the carry-out process, and the cleaning process are sequentially performed, the pusher pin torque may be reduced as compared with the case in which the attachment process is not performed. In other words, when the attachment process, the carry-in process, the adsorption process, the plasma processing process, the separation process, the carry-out process, and the cleaning process are sequentially performed, the residual adsorptive force that disturbs the separation of the wafer W may be reduced as compared with the case in which the attachment process is not performed.

As illustrated in FIGS. 4B and 4C, when the lot of sequentially performing the attachment process, the carry-in process, the adsorption process, the plasma processing process, the separation process, the carry-out process, and the cleaning process is repeated multiple times, and thereafter, other processes other than the attachment process are sequentially performed, the pusher pin torque is continuously reduced. That is, it can be seen that the lot of sequentially performing the attachment process, the carry-in process, the adsorption process, the plasma processing process, the separation process, the carry-out process, and the cleaning process is repeated multiple times to continuously reduce the residual adsorptive force in respect to a predetermined lot without performing the attachment process.

Figure 5A:
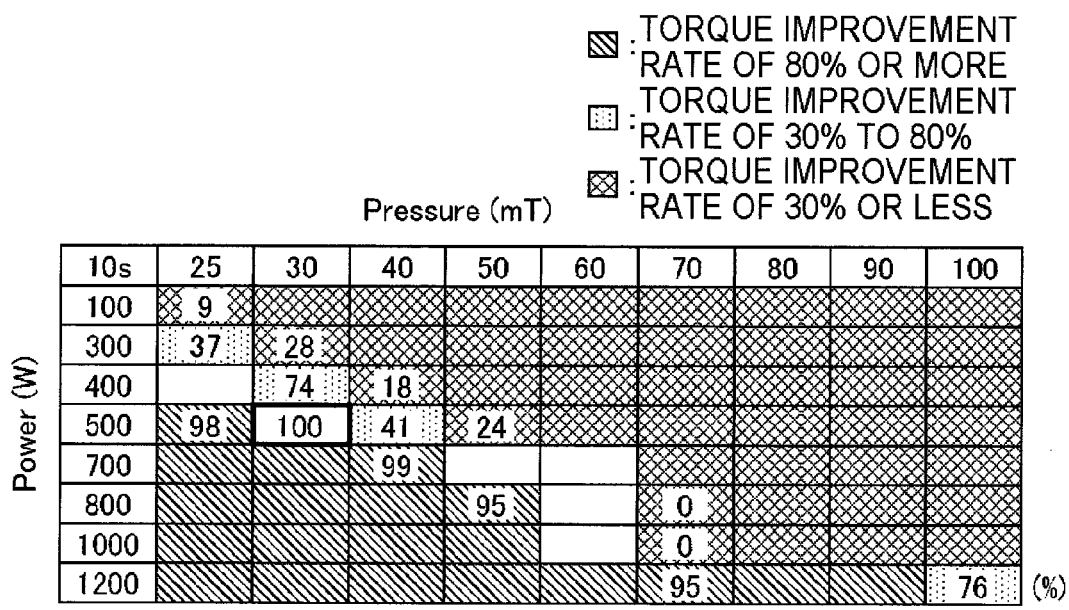
FIG. 5A is a diagram (1 thereof) illustrating a relationship between various conditions and torque improvement rate used in the attachment process in the first embodiment.
Figure 5B:
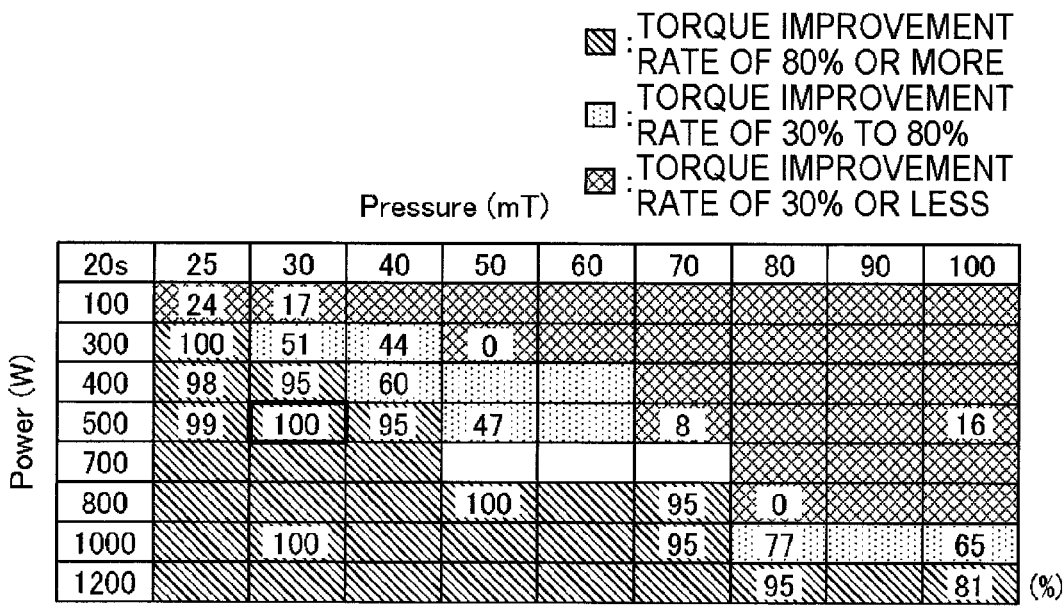
FIG. 5B is a diagram (1 thereof) illustrating the relationship between various conditions and the torque improvement rate used in the attachment process in the first embodiment.

FIGS. 5A and 5B are diagrams (1 thereof) illustrating the relationship between various conditions and the torque improvement rate used in the attachment process in the first embodiment. In FIGS. 5A and 5B, 'Pressure(mT)' represents pressure mT in the chamber 10, which is used in the attachment process, and 'Power(W)' represents the high-frequency power W applied to the shower head 33, which is used in the attachment process. Further, In FIGS. 5A and 5B, torque improvement rate (%) represents an index value expressed by Equation (1) given below, and as a value of the torque improvement rate increases, the residual adsorptive force decreases.

$$\text{Torque improvement rate } (\%) = A/B \quad (1)$$

Wherein,

A: A difference value between an average value of a plurality of pusher pin torques acquired when the lot of sequentially performing the carry-in process, the adsorption process, the plasma processing process, the separation process, the carry-out process, and the cleaning process is repeated multiple times without performing the attachment process and a value of a pusher pin torque acquired when the lot of sequentially performing the attachment process, the carry-in process, the adsorption process, the plasma processing process, the separation process, the carry-out process, and the cleaning process is performed once B: A difference value between the average value of the plurality of pusher pin torques acquired when the lot of sequentially performing the carry-in process, the adsorption process, the plasma processing process, the separation process, the carry-out process, and the cleaning process is repeated multiple times without performing the attachment process and a reference value of predetermined pusher pin torque.

In FIG. 5A, Ar=1200 sccm is used as the processing gas of the attachment process and the torque improvement rate acquired when the attachment process is performed for 10 seconds as the processing time of the attachment process is illustrated. Further, in FIG. 5B, Ar=1200 sccm is used as the processing gas of the attachment process and the torque improvement rate acquired when the attachment process is performed for 20 seconds as the processing time of the attachment process is illustrated.

As illustrated in FIGS. 5A and 5B, as the pressure in the chamber 10 is low and as the high-frequency power applied to the shower head 33 is larger, the torque improvement rate is improved. In other words, as the pressure in the chamber 10 is low and the high-frequency power applied to the shower head 33 is large, the residual adsorptive force is reduced. Therefore, preferably, the pressure in the deposition processing is 25 mTorr (3.33 Pa) to 200 mTorr (26.6 Pa) and the high-frequency power is 300 W to 1500 W. More preferably, the pressure in the deposition processing is 30 mTorr (3.99 Pa) to 200 mTorr (26.6 Pa) the high-frequency power is 400 W to 1500 W. Still more preferably, the pressure is 30 mTorr (3.99 Pa) to 100 mTorr (13.3 Pa) and the high-frequency power is 400 W to 1200 W.

As illustrated in FIGS. 5A and 5B, when the processing time of the attachment process is 10 seconds, the torque improvement rate is 80% or more in a comparatively wide range among ranges of various conditions (the pressure in the chamber 10 and the high-frequency power applied to the shower head 33) used in the attachment process. That is, when the processing time of the attachment process is 10 seconds, the residual adsorptive force is reduced in the comparatively wide range. In addition, when the processing time of the attachment process is 20 seconds, the range in which the torque improvement rate is 80% or more is increased, as compared with the processing time of the attachment process is 10 seconds. Therefrom, it can be seen that the processing time of the attachment process is, for example, preferably 10 seconds or more and more preferably 20 seconds or more. Accordingly, the processing time of the attachment process is preferably 5 seconds to 120 seconds, and more preferably 10 seconds to 30 seconds from the viewpoints of the stabilization time of plasma and the damage to the members in the chamber.

Figure 6A:
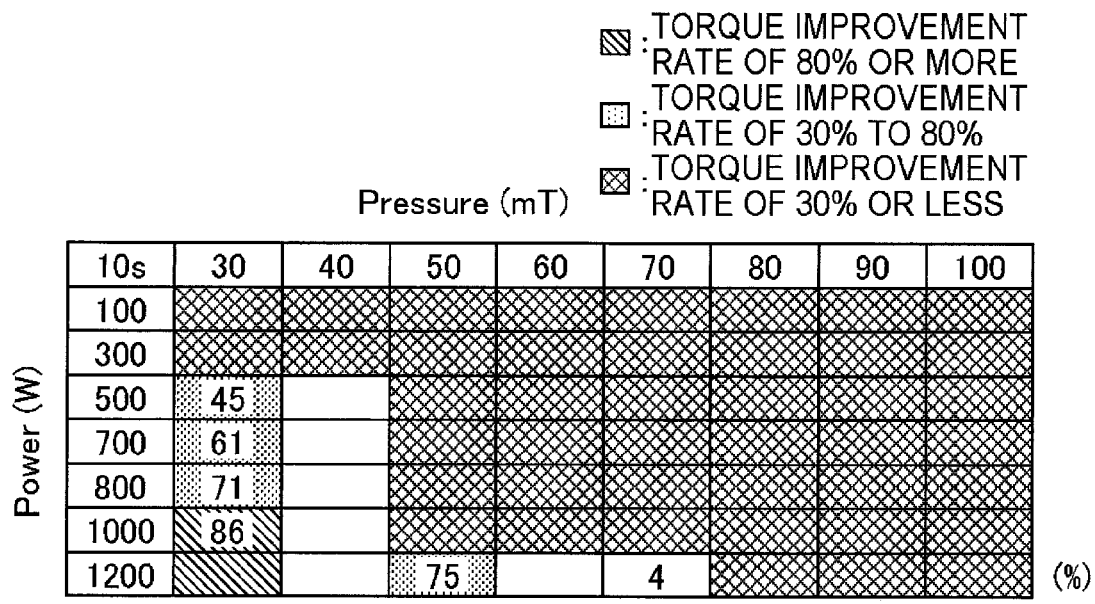
FIG. 6A is a diagram (2 thereof) illustrating the relationship between various conditions and the torque improvement rate used in the attachment process in the first embodiment.
Figure 6B:
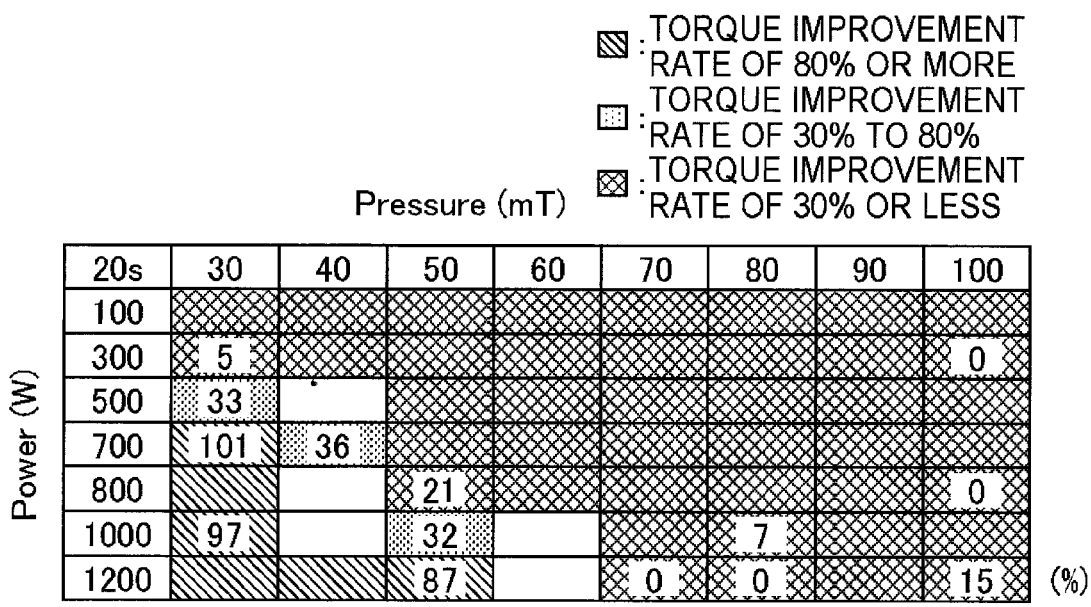
FIG. 6B is a diagram (2 thereof) illustrating the relationship between various conditions and the torque improvement rate used in the attachment process in the first embodiment.

FIGS. 6A and 6B are diagrams (1 thereof) illustrating the relationship between various conditions and the torque improvement rate used in the attachment process in the first embodiment. In FIGS. 6A and 6B, the torque improvement rate (%) represents the index value expressed by Equation (1) given above, and as the value of the torque improvement rate increases, the residual adsorptive force decreases. In FIGS. 6A and 6B, 'Pressure(mT)' represents the pressure mT in the chamber 10, which is used in the attachment process, and 'Power(W)' represents the high-frequency power W applied to the shower head 33, which is used in the attachment process. In FIGS. 6A and 6B, the torque improvement rate (%) represents the index value expressed by Equation (1) given above, and as the value of the torque improvement rate increases, the residual adsorptive force decreases.

In FIG. 6A, the torque improvement rate acquired when $O_2$=1200 sccm is used as the processing gas of the attachment process and the attachment process is performed for 10 seconds as the processing time of the attachment process is illustrated. Further, in FIG. 6B, the torque improvement rate acquired when $O_2$=1200 sccm is used as the processing gas of the attachment process and the attachment process is performed for 20 seconds as the processing time of the attachment process is illustrated.

As illustrated in FIGS. 6A and 6B, as the pressure in the chamber 10 is low and the high-frequency power applied to the shower head 33 is large, the torque improvement rate is improved. In other words, as the pressure in the chamber 10 is low and the high-frequency power applied to the shower head 33 is large, the residual adsorptive force is reduced.

As illustrated in FIGS. 6A and 6B, when the processing time of the attachment process is 10 seconds, the torque improvement rate is 80% or more in a comparatively wide range among ranges of various conditions (the pressure in the chamber 10 and the high-frequency power applied to the shower head 33) used in the attachment process. That is, when the processing time of the attachment process is 10 seconds, the residual adsorptive force is reduced in the comparatively wide range. In addition, when the processing time of the attachment process is 20 seconds, the range in which the torque improvement rate is 80% or more is increased, as compared with the processing time of the attachment process is 10 seconds. Therefrom, it can be seen that the processing time of the attachment process is, for example, preferably 10 seconds or more and more preferably 20 seconds or more. Accordingly, the processing time of the attachment process is preferably 5 seconds to 120 seconds, and more preferably 10 seconds to 30 seconds from the viewpoints of the stabilization time of plasma and the damage to the members in the chamber.

Meanwhile, when $O_2$=1200 sccm is used as the processing gas of the attachment process, the range in which the torque improvement rate is 80% or more is decreased, as compared with the case in which Ar=1200 sccm is used as the processing gas of the attachment process. However, the torque improvement rate acquired when $O_2$=1200 sccm is used as the processing gas of the attachment process is a value that satisfies a predetermined specification.

As described above, the plasma processing apparatus 1 of the first embodiment performs an attachment process of attaching the Si-containing material to the electrostatic chuck 20 attached with the attached matter or the reaction product containing C and F by generating the plasma of the processing gas containing at least one of Ar, He, $O_2$, and $N_2$ and sputtering the shower head 33 including Si by the ions in the plasma. In addition, the plasma processing apparatus 1 performs an adsorption process of adsorbing the workpiece by the electrostatic chuck 20 attached with the Si-containing material. In addition, the plasma processing apparatus 1 performs a plasma processing process of plasma-processing the workpiece. In addition, the plasma processing apparatus 1 performs a separation process of separating the workpiece processed with plasma from the electrostatic chuck 20 attached with the Si-containing material. As a result, the attached matter or the reaction product attached to the electrostatic chuck 20 is covered by the Si-containing material together with the electrostatic chuck 20 and thereafter, the workpiece may be adsorbed by the electrostatic chuck 20. In other words, movement of electric charges between the wafer W adsorbed by the electrostatic chuck 20 and the attached matter attached to the electrostatic chuck 20 may be blocked by the Si-containing material. As a result, the residual adsorptive force that disturbs the separation of the wafer W from the electrostatic chuck 20 may be reduced.

The plasma processing apparatus 1 of the first embodiment attaches the Si-containing material to the electrostatic chuck 20 attached with the attached matter or the reaction product containing C and F, during a period until the workpiece which is not plasma-processed is carried into the chamber 10 after the attached matter containing C and F which remains in the chamber 10 is removed by the plasma of the $O_2$-containing gas. As a result, after dry cleaning (DC) using the $O_2$-containing gas is performed, the attached matter attached to the electrostatic chuck 20 may be covered by the Si-containing material together with the electrostatic chuck 20. Consequently, the residual adsorptive force generated by the DC using the $O_2$-containing gas may be reduced. Accordingly, since the plasma-processed substrate may be smoothly pinned up without a load, the substrate may be carried out of the chamber without damaging the substrate in the chamber.

In the plasma processing apparatus 1 of the first embodiment, the processing time of the attachment process is a predetermined time or more. As a result, the residual adsorptive force that disturbs the separation of the wafer W from the electrostatic chuck 20 may be stably reduced.

Second Exemplary Embodiment

In the first embodiment, in the attachment process, the example in which the Si-containing material is attached to the electrostatic chuck 20 has been described. However, in the attachment process, an N-containing material may be attached to the electrostatic chuck 20. In the second embodiment, an example in which the N-containing material is attached to the electrostatic chuck 20 will be described. Meanwhile, since a configuration of the plasma processing apparatus according to the second embodiment is similar to the configuration of the plasma processing apparatus according to the first embodiment, only a difference from the configuration of the plasma processing apparatus according to the first embodiment will be described herein.

In the plasma processing apparatus 1 according to the second embodiment, the CPU 53 controls each component of the plasma processing apparatus to perform a plasma processing method to be described below. As one detailed example, the CPU 53 generates plasma of processing gas containing $N_2$ to attach the N-containing material to the electrostatic chuck 20 attached with the reaction product containing C and F, while the workpiece is not mounted on the electrostatic chuck 20. In addition, the CPU 53 adsorbs the workpiece by the electrostatic chuck 20 attached with the N-containing material and plasma-processes the adsorbed workpiece. In addition, the CPU 53 separates the workpiece processed with plasma from the electrostatic chuck 20 attached with the N-containing material. Herein, for example, when the attached matter containing C and F, for example, the attached matter containing C and F which remains in the chamber 10 is removed by the plasma of the $O_2$-containing gas, some of the reaction product containing C and F is diffused and attached to the surface of the electrostatic chuck 20 to acquire the attached matter containing C and F. In addition, the workpiece is, for example, the wafer W.

Figure 7:
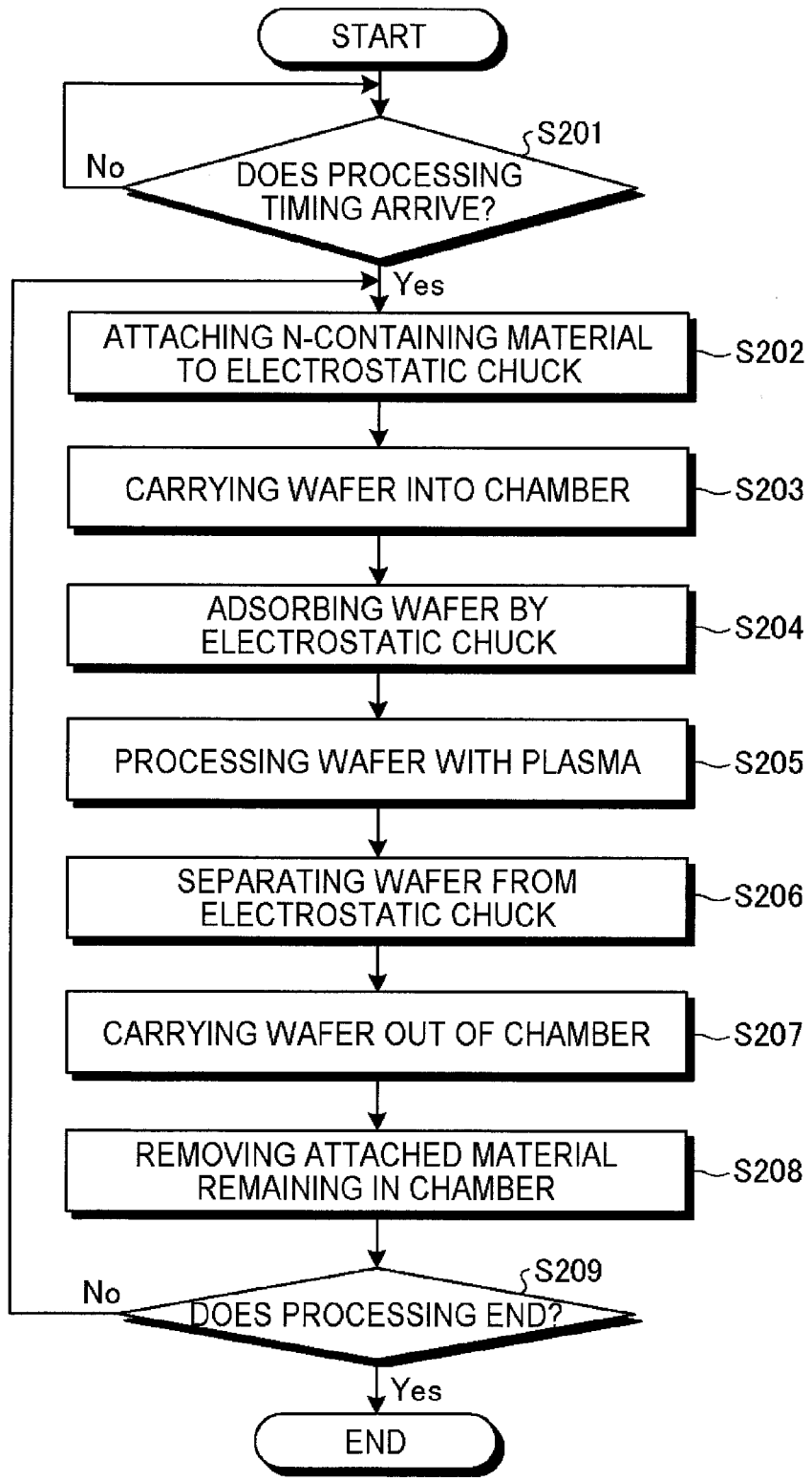
FIG. 7 is a flowchart illustrating an example of a flow of processing of a plasma processing method by a plasma processing apparatus according to a second embodiment.

Subsequently, one example of the flow of the processing of the plasma processing method by the plasma processing apparatus 2 according to the first embodiment will be described. FIG. 7 is a flowchart illustrating one example of a flow of processing of a plasma processing method by a plasma processing apparatus according to a first embodiment. Meanwhile, hereinafter, it is assumed that a cleaning process of removing the attached matter containing C and F which remains in the chamber 10 by using the plasma of the $O_2$-containing gas is performed at the previous time, and as a result, the reaction product containing C and F is diffused toward the electrostatic chuck 20 to be attached to the surface of the electrostatic chuck 20.

As illustrated in FIG. 7, the plasma processing apparatus 1 stands by until a processing timing arrives (step S201, No). The plasma processing apparatus 1 performs the attachment process of attaching the N-containing material to the electrostatic chuck 20 by generating the plasma of the processing gas containing $N_2$, while the workpiece is not mounted on the electrostatic chuck 20, when the processing timing arrives (step S201, Yes). In detail, the plasma processing apparatus 1 attaches the N-containing material to the electrostatic chuck 20 attached with the reaction product containing C and F, during a period until the wafer W which is not plasma-processed is carried into the chamber 10, after the attached matter containing C and F which remains in the chamber 10 is removed by the cleaning process at the previous time. For example, the plasma processing apparatus 1 attaches the N-containing material by using $N_2$ or $N_2/O_2$ as the processing gas containing $N_2$. Further, a processing time of the attachment process is preferably a predetermined time or more, for example, preferably 10 seconds or more and more preferably 20 seconds or more.

Figure 8:
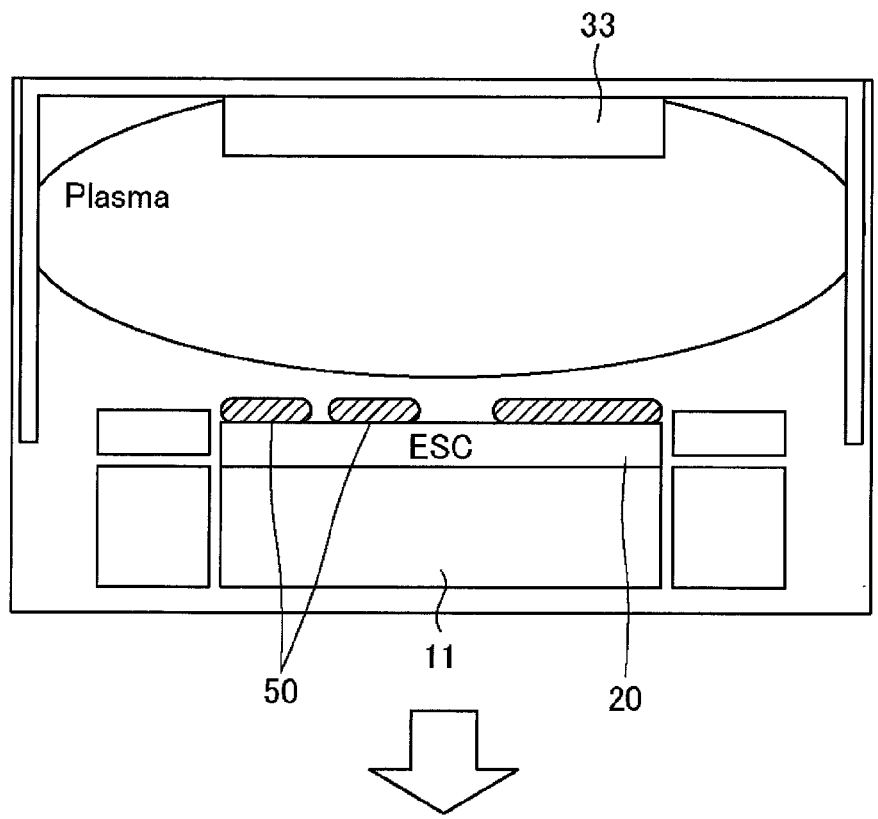
FIG. 8 is a diagram illustrating an attachment process in the second embodiment.
Figure 8:
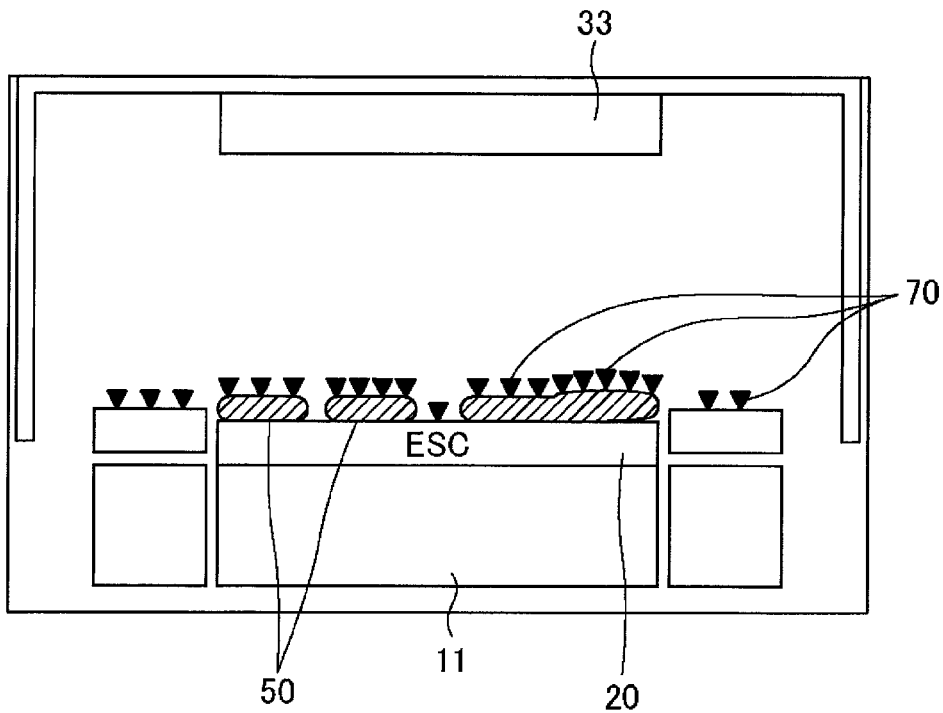

FIG. 8 is a diagram illustrating an attachment process in the second embodiment. In an example of FIG. 8, it is assumed that a reaction product 50 containing C and F is attached to the electrostatic chuck 20. The CPU 53 of the plasma processing apparatus 1 supplies the processing gas containing $N_2$ into the chamber 10 from the shower head 33 and applies high-frequency power for generating plasma to the susceptor 11 from the high-frequency power supply 18. In this case, the CPU 53 does not apply the high-frequency power from the high-frequency power supply 52. As a result, as illustrated in FIG. 8(1), the plasma of the processing gas containing $N_2$ is generated. Then, as illustrated in FIG. 8(2), an N-containing material 70 is attached to the surface of the electrostatic chuck 20 attached with the reaction product 50 containing C and F. As a result, the reaction product 50 attached to the electrostatic chuck 20 is covered by the N-containing material together with the electrostatic chuck 20. In other words, movement of electric charges between the wafer W adsorbed by the electrostatic chuck 20 and the reaction product 50 attached to the electrostatic chuck 20 is blocked by the N-containing material 70. As a result, the residual adsorptive force that disturbs the separation of the wafer W from the electrostatic chuck 20 may be reduced. Further, a mechanism of blocking the movement of the charges by the N-containing material 70 will be described later.

The description of FIG. 7 is returned. Subsequently, the plasma processing apparatus 1 performs a carry-in process of carrying the workpiece into the chamber 10 (step S203).

A more detailed example will be described. The CPU 53 of the plasma processing apparatus 1 carries the wafer W into the chamber 10 from the gate valve 32 and the carry-in/out port 31 and mounts the carried-in wafer W on the electrostatic chuck 20.

Subsequently, the plasma processing apparatus 1 performs an adsorption process of adsorbing the workpiece by the electrostatic chuck 20 attached with the N-containing material (step S204).

A more detailed example will be described. The CPU 53 of the plasma processing apparatus 1 applies the DC voltage to the electrode plate 35 of the electrostatic chuck 20 from the DC power supply 22 to adsorb the wafer W onto the susceptor 11.

Subsequently, the plasma processing apparatus 1 performs a plasma processing process of plasma-processing the workpiece by the plasma of the processing gas (step S205). For example, the plasma processing apparatus 1 plasma-processes the wafer W adsorbed by the electrostatic chuck 20 by using the processing gas, for example, CF based gas. Then, the wafer W is plasma-processed, and as a result, the reaction product containing C and F is attached to an inner wall of the chamber 10 or the shower head 33 in the chamber 10. That is, the reaction product containing C and F remains in the chamber 10.

A more detailed example will be described. The CPU 53 of the plasma processing apparatus 1 supplies the processing gas into the chamber 10 from the shower head 33 and applies high-frequency power for generating plasma to the susceptor 11 from the high-frequency power supply 18. In this case, the CPU 53 does not apply the high-frequency power from the high-frequency power supply 52. As a result, the wafer W is plasma-processed.

Subsequently, the plasma processing apparatus 1 performs a separation process of separating the workpiece processed with plasma from the electrostatic chuck 20 attached with the N-containing material (step S206).

A more detailed example will be described. The CPU 53 of the plasma processing apparatus 1 stops applying the DC voltage to the electrode plate 35 of the electrostatic chuck 20 and simultaneously makes the pusher pins 30 protrude from the electrostatic chuck 20 to separate the wafer W from the electrostatic chuck 20.

Subsequently, the plasma processing apparatus 1 performs a carry-out process of carrying the workpiece out of the chamber 10 (step S207).

A more detailed example will be described. The CPU 53 of the plasma processing apparatus 1 carries the wafer W separated from the electrostatic chuck 20 out of the chamber 10 through the carry-in/out port 31 and the gate valve 32.

Subsequently, the plasma processing apparatus 1 performs a cleaning process of removing the attached matter containing C and F which remains in the chamber 10 by the plasma of the $O_2$-containing gas, while the workpiece is not mounted on the electrostatic chuck 20, when the workpiece is carried out of the chamber 10 (step S208). For example, the plasma processing apparatus 1 removes the attached matter containing C and F as the reaction product containing C and F, by using $O_2$ as the $O_2$-containing gas. Then, the removed attached matter containing C and F is diffused toward the electrostatic chuck 20 as the reaction product containing C and F to be attached to the surface of the electrostatic chuck 20.

A more detailed example will be described. The CPU 53 of the plasma processing apparatus 1 supplies $O_2$ into the chamber 10 from the shower head 33 and applies high-frequency power for generating plasma to the susceptor 11 from the high-frequency power supply 18. In this case, the CPU 53 does not apply the high-frequency power from the high-frequency power supply 52. As a result, the attached matter containing C and F is removed as the reaction product containing C and F by plasma of $O_2$ and diffused toward the electrostatic chuck 20 as the reaction product containing C and F to be attached to the surface of the electrostatic chuck 20.

Subsequently, the plasma processing apparatus 1 determines whether the processing is ended (step S209). The plasma processing apparatus 1 returns the processing to step S202 and repeats steps S202 to S209 when the processing is continued (step S209, No). Meanwhile, the plasma processing apparatus 1 ends the processing when the processing is ended (step S209, Yes). Further, in a case where the attachment process (step S202) is performed in every wafer processing, the process of determining whether the processing is ended (step S209) may be omitted.

Meanwhile, in the example illustrated in FIG. 7, it is presumed that when the cleaning process is performed at the previous time, the reaction product containing C and F is diffused to the electrostatic chuck 20 to be attached to the surface of the electrostatic chuck 20, but the present disclosure is not limited thereto. For example, as necessary, the cleaning process of step S208 may be omitted. In this case, when the plasma processing process of step S205 is performed at the previous time, the reaction product containing C and F is attached to the surface of the electrostatic chuck 20. Therefore, the reaction product containing C and F remains on the surface of the electrostatic chuck 20. For example, the reaction product containing C and F, which is not pumped when the plasma processing process is performed at the previous time, is attached to the surface of the electrostatic chuck 20. In the second embodiment, although the cleaning process of step S208 is omitted, the attachment process of step S202 is performed, and as a result, the reaction product attached to the electrostatic chuck 20 may be covered by the N-containing material together with the electrostatic chuck 20. In other words, movement of electric charges between the wafer W adsorbed by the electrostatic chuck 20 and the reaction product attached to the electrostatic chuck 20 is blocked by the N-containing material. As a result, the residual adsorptive force that disturbs the separation of the wafer W from the electrostatic chuck 20 may be reduced.

As described above, the plasma processing apparatus 1 of the second embodiment performs an attachment process of attaching the N-containing material to the electrostatic chuck 20 attached with the reaction product containing C and F by generating plasma of processing gas containing $N_2$, while the workpiece is not mounted on the electrostatic chuck 20. In addition, the plasma processing apparatus 1 performs an adsorption process of adsorbing the workpiece by the electrostatic chuck 20 attached with the N-containing material. In addition, the plasma processing apparatus 1 performs a plasma processing process of plasma-processing the workpiece. In addition, the plasma processing apparatus 1 performs a separation process of separating the workpiece processed with plasma from the electrostatic chuck 20 attached with the N-containing material. As a result, the reaction product attached to the electrostatic chuck 20 is covered by the N-containing material together with the electrostatic chuck 20 and thereafter, the workpiece may be adsorbed by the electrostatic chuck 20. In other words, movement of electric charges between the wafer W adsorbed by the electrostatic chuck 20 and the reaction product attached to the electrostatic chuck 20 is blocked by the N-containing material. As a result, the residual adsorptive force that disturbs the separation of the wafer W from the electrostatic chuck 20 may be reduced.

Figure 9:
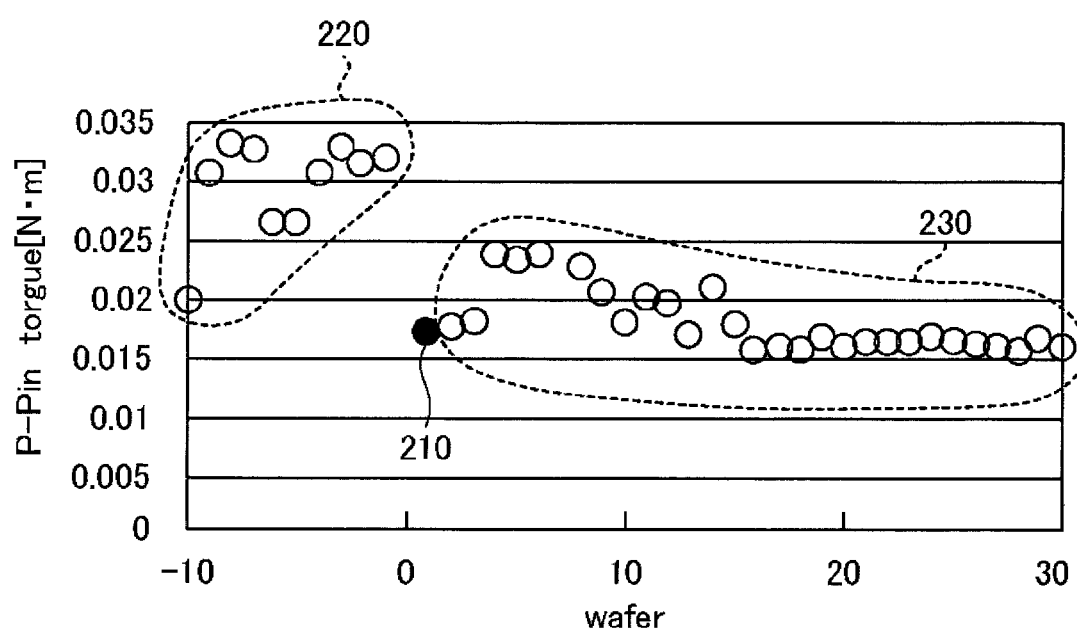
FIG. 9 is an explanatory diagram for describing a meaning of implementing the attachment process in the second embodiment.

Subsequently, the attachment process in the second embodiment will be described in more detail. FIG. 9 is an explanatory diagram for describing a meaning of implementing the attachment process in the second embodiment. In FIG. 9, a longitudinal axis represents torque (that is, pusher pin torque) (N·M) generated by a rotary shaft of a motor when the pusher pins 30 separate the wafer W from the electrostatic chuck 20, and a transverse axis represents a lot number of the wafer W which is a measurement object of the pusher pin torque.

In FIG. 9, a measurement point 210 represents pusher pin torque acquired when the attachment process, the carry-in process, the adsorption process, the plasma processing process, the separation process, the carry-out process, and the cleaning process are sequentially performed. In addition, in FIG. 9, a measurement point group 220 represents pusher pin torque acquired when other processes except for the attachment process are sequentially performed without performing the attachment process, before the attachment process, the carry-in process, the adsorption process, the plasma processing process, the separation process, the carry-out process, and the cleaning process are sequentially performed. In addition, in FIG. 9, a measurement point group 230 represents pusher pin torque acquired when other processes except for the attachment process are sequentially performed without performing the attachment process, after the attachment process, the carry-in process, the adsorption process, the plasma processing process, the separation process, the carry-out process, and the cleaning process are sequentially performed. Besides, the attachment process is performed under conditions including pressure: 3.99 Pa (30 mTorr), high-frequency power: 200 W, processing gas: $N_2$=300 sccm, and processing time: 20 seconds.

As illustrated in FIG. 9, when the attachment process, the carry-in process, the adsorption process, the plasma processing process, the separation process, the carry-out process, and the cleaning process are sequentially performed, the pusher pin torque may be reduced, as compared with the case in which other processes are performed without performing the attachment process. In other words, when the attachment process, the carry-in process, the adsorption process, the plasma processing process, the separation process, the carry-out process, and the cleaning process are sequentially performed, the residual adsorptive force that disturbs the separation of the wafer W may be reduced, as compared with the case in which the attachment process is not performed.

Figure 10:
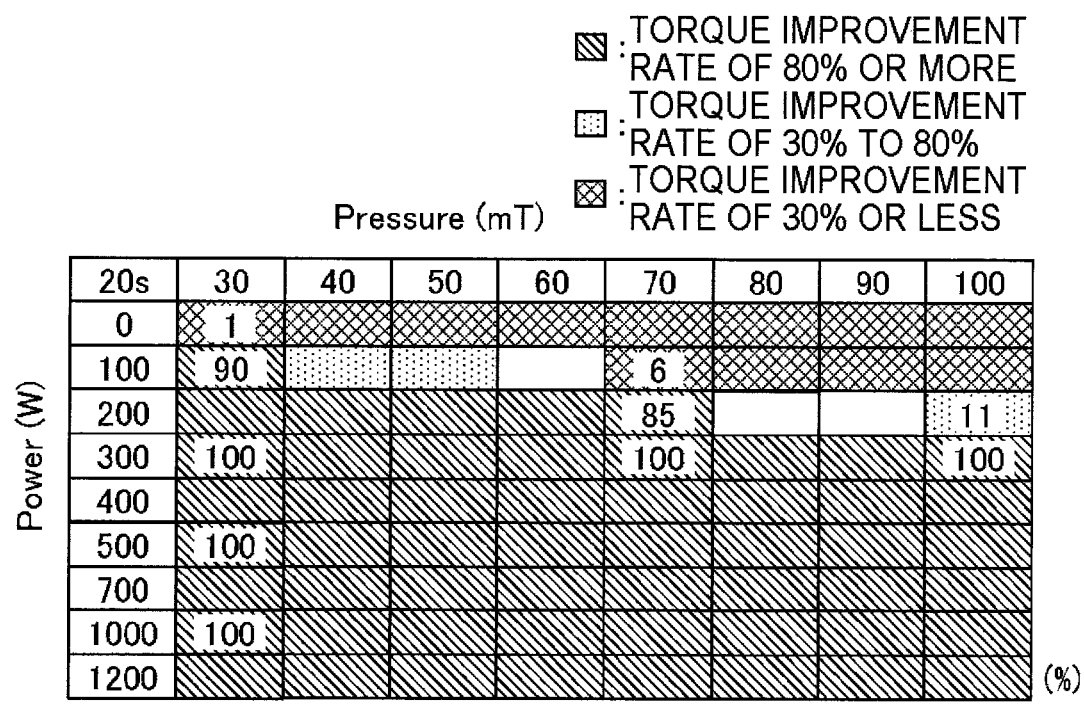
FIG. 10 is a diagram illustrating a relationship between various conditions and torque improvement rate used in the attachment process in the second embodiment.

FIG. 10 is a diagram illustrating a relationship between various conditions and torque improvement rate used in the attachment process in the second embodiment. In FIG. 10, 'Pressure (mT or Pa)' represents the pressure (mT or Pa) in the chamber 10, which is used in the attachment process, and 'Power (W)' represents the high-frequency power W applied to the shower head 33, which is used in the attachment process. In FIG. 10, the torque improvement rate (%) represents the index value expressed by Equation 1 given above, and as the value of the torque improvement rate increases, the residual adsorptive force decreases.

In FIG. 10, the torque improvement rate acquired when $N_2$=200 sccm is used as the processing gas of the attachment process and the attachment process is performed for 20 seconds as the processing time of the attachment process is illustrated.

As illustrated in FIG. 10, as the pressure in the chamber 10 is low and the high-frequency power applied to the susceptor 11 is large, the torque improvement rate is improved. In other words, as the pressure in the chamber 10 is low and the high-frequency power applied to the susceptor 11 is large, the residual adsorptive force is reduced.

Figure 11:
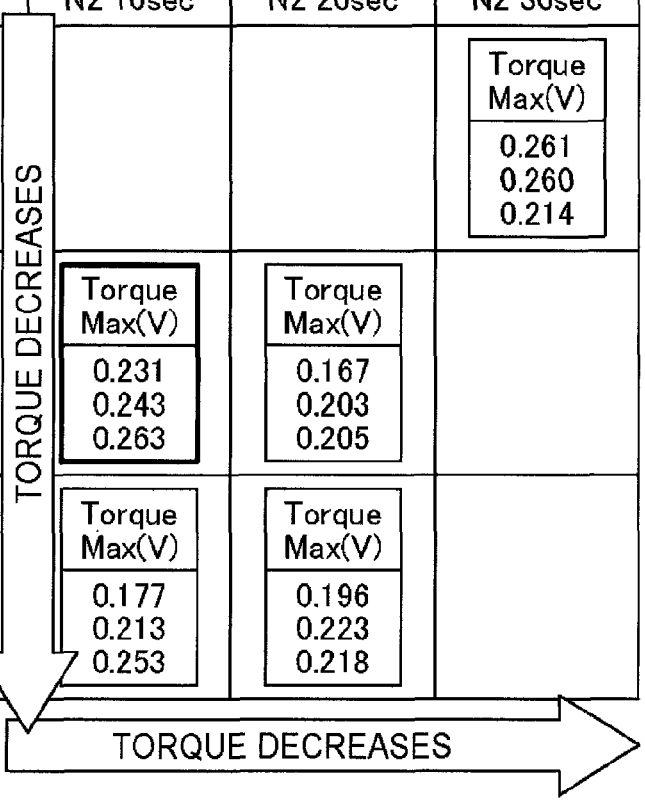
FIG. 11 is an explanatory diagram for describing a reduction in residual adsorptive force by the attachment process in the second embodiment.

FIG. 11 is a diagram for describing a reduction in residual adsorptive force by the attachment process in the second embodiment. FIG. 11 illustrates a pusher pin torque acquired when the cleaning process is performed using $O_2$ gas, the attachment process is performed using the plasma of $N_2$ gas, and then, the separation process is performed. In FIG. 11, 'Torque Max (V)' represents a voltage value (V) of the motor in terms of a pusher pin torque (N·M). Further, the pusher pin torque is measured three times. Further, the cleaning process is performed under conditions including pressure: 53.3 Pa (400 mTorr), high-frequency power (HF/LF): 800 W/0 W, processing gas: $O_2$=700 sccm, and processing time: 60 or 120 seconds. Besides, the attachment process is performed under conditions including pressure: 4 Pa (30 mTorr), 26.7 Pa (200 mTorr) or 53.3 Pa (400 mTorr), high-frequency power (HF/

LF): 700 W/0 W, processing gas: $N_2$=700 sccm, and processing time: 10, 20 or 30 seconds.

In FIG. 11, the initial value of the pusher pin torque is 0.249 (V).

As illustrated in FIG. 11, as the processing time of the attachment process is longer and the pressure in the chamber 10 is lower, the pusher pin torque is reduced. In other words, as the processing time of the attachment process is longer and the pressure in the chamber 10 is lower, the residual adsorptive force that disturbs the separation of the wafer W from the electrostatic chuck 20 is reduced. The present inventors have studied intensively and found out that the value of the pusher pin torque falls within a predetermined allowable range when the processing time of the attachment process, the high-frequency power for generating plasma, and the pressure in the chamber 10 are within the following ranges.

That is, the processing time of the attachment process is preferably 5 seconds to 60 seconds. If the processing time of the attachment process is less than 5 seconds, the plasma of the processing gas containing $N_2$ is not stabilized. Meanwhile, if the processing time of the attachment exceeds 60 seconds, the throughput of the process is reduced.

Further, the high-frequency used for generating plasma of the processing gas containing $N_2$, that is, the high-frequency for generating plasma is preferably 400 W to 2,000 W. If the high-frequency for generating plasma is less than 400 W, the N-containing material is not attached sufficiently to the electrostatic chuck 20. Meanwhile, if the high-frequency for generating plasma exceeds 2,000 W, the electrostatic chuck 20 may be damaged by the high-frequency for generating plasma.

When the attachment process is performed, the pressure in the chamber 10 is preferably maintained in a range of 5 mTorr (6.67 Pa) to 800 mTorr (107 Pa). If the pressure in the chamber 10 is less than 5 mTorr (6.67 Pa), the electrostatic chuck 20 may be damaged by the sputtering of $N_2$ ions. If the pressure in the chamber 10 exceeds 800 mTorr (107 Pa), the N-containing material is attached excessively to the electrostatic chuck 20, and hence, the electrostatic adsorptive force is reduced.

Next, a mechanism of blocking the movement of the charges by the N-containing material 70 in the second exemplary embodiment will be described. Before describing the mechanism of blocking the movement of the charges by the N-containing material 70, descriptions will be made on a movement of the charges in a case where the attachment process is not performed after the cleaning process is performed, as a premise thereof. FIG. 12A is a view illustrating a movement of charges in a case where the attachment process is not performed after the cleaning process is performed.

When the cleaning processing is performed using plasma of $O_2$-containing gas, the reaction product 50 containing C and F, which remains in the chamber 10, is attached to the surface of the electrostatic chuck 20 as illustrated in (1) of FIG. 12A. The surface of the electrostatic chuck 20 is modified with a material having a relatively low resistance by the reaction product 50. Then, the carry-in process and the adsorption process are performed. In the following descriptions, the DC voltage applied from the DC power supply 22 to the electrode 21 of the electrostatic chuck 20 is, for example, 2.5 kV in the adsorption process.

Subsequently, the plasma processing process is performed. Then, a leak current is generated on the surface of the electrostatic chuck 20 through the reaction product attached to the electrostatic chuck 20, as illustrated in (2)-1 of FIG. 12A. Then, a surface potential of the electrostatic chuck 20 is decreased from 2.5 kV due to the generation of the leak current, as illustrated in (2)-2 of FIG. 12A. Further, a potential of the base (insulation layer) of the electrostatic chuck 20 is maintained at 2.5 kV, as illustrated in (2)-2 of FIG. 12A.

Thereafter, the separation process is started. When the application of the DC voltage of the electrostatic chuck 20 to the electrode 21 is stopped in the separation process, the potential of the base (insulation layer) of the electrostatic chuck 20 is decreased from 2.5 kV to 0 V, as illustrated in (2)-2 of 12A. Meanwhile, the surface potential of the electrostatic chuck 20 is decreased to a negative side by an amount decreased due to the generation of the leak current. Therefore, a negative charge corresponding to the decrease amount of the surface potential of the electrostatic chuck 20 is generated on the surface of the electrostatic chuck 20. The negative charge generated on the surface of the electrostatic chuck 20 remains as a residual charge. A force drawing the wafer W towards the surface of the electrostatic chuck 20, that is, a residual adsorptive force is generated by the residual charge.

Thereafter, when the pusher pins 30 protrude from the electrostatic chuck 20, an external force along a direction away from the electrostatic chuck 20 is applied to the wafer W, while a residual adsorptive force along a direction approaching the surface of the electrostatic chuck 20 is applied to the wafer W. Therefore, the separation of the wafer W is disturbed by the residual adsorptive force. Then, since a torque is applied to the motor of the pusher pins 30, the wafer W is damaged with the protrusion of the pusher pins 30.

Figure 12B:
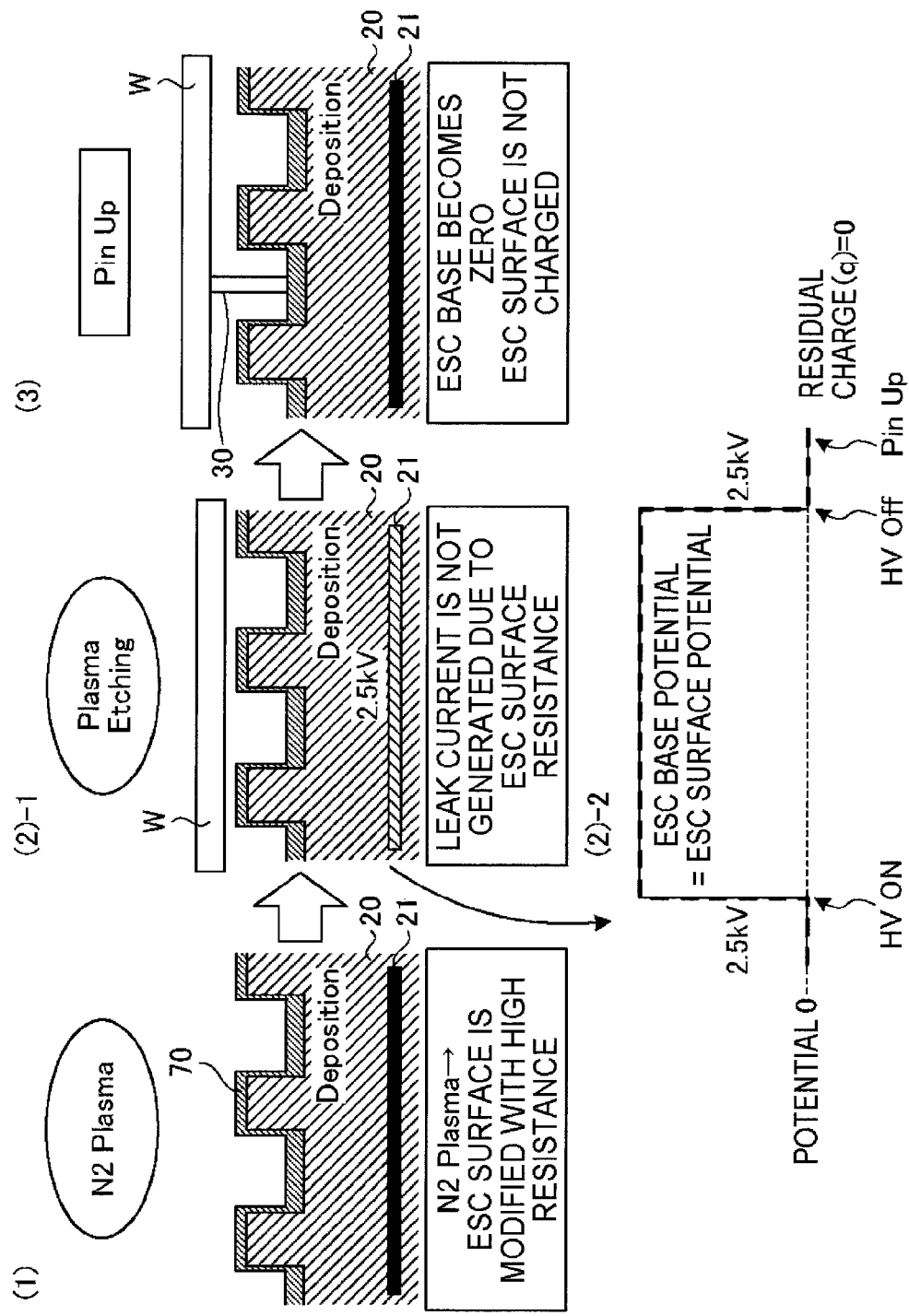
FIG. 12B is a view for describing a mechanism of blocking the movement of the charges by a N-containing material in the second exemplary embodiment.

In this regard, a mechanism of blocking the movement of the charges by the N-containing material in the second exemplary embodiment will be described. FIG. 12B is a view for describing a mechanism of blocking the movement of the charges by a N-containing material in the second exemplary embodiment.

When the attachment processing is performed using plasma of $N_2$-containing gas, the N-containing material is attached to the surface of the electrostatic chuck 20 as illustrated in (1) of FIG. 12B. The surface of the electrostatic chuck 20 is modified with a material having a relatively high resistance by the N-containing material 70. Then, the carry-in process and the adsorption process are performed. In the following descriptions, the DC voltage applied from the DC power supply 22 to the electrode 21 of the electrostatic chuck 20 is, for example, 2.5 kV in the adsorption process.

Subsequently, the plasma processing process is performed. Since the surface of the electrostatic chuck 20 is modified with a material having a relatively high resistance, a leak current is not generated on the surface of the electrostatic chuck 20, as illustrated in (2)-1 of FIG. 12B. Therefore, the surface potential of the electrostatic chuck 20 and the potential of the base (insulation layer) of the electrostatic chuck 20 are all maintained at 2.5 kV.

Thereafter, the separation process is started. When the application of the DC voltage of the electrostatic chuck 20 to the electrode 21 is stopped in the separation process, the surface potential of the electrostatic chuck 20 and the potential of the base (insulation layer) of the electrostatic chuck 20 are all decreased from 2.5 kV to 0 V. Therefore, the surface of the electrostatic chuck 20 is not charged, and consequentially, the movement of the charges between the wafer W adsorbed by the electrostatic chuck 20 and the reaction product attached to the electrostatic chuck 20 is blocked by the N-containing material 20.

Thereafter, when the pusher pins 30 protrude from the electrostatic chuck 20, an external force along a direction away from the electrostatic chuck 20 is applied to the wafer W. As a result, the wafer W is separated from the electrostatic chuck 20 without being damaged, as illustrated in (3) of FIG. 12B.

As described above, the plasma processing apparatus 1 of the second embodiment performs an attachment process of attaching the N-containing material to the electrostatic chuck 20 attached with the reaction product containing C and F by generating plasma of processing gas containing $N_2$, while the workpiece is not mounted on the electrostatic chuck 20. In addition, the plasma processing apparatus 1 performs an adsorption process of adsorbing the workpiece by the electrostatic chuck 20 attached with the N-containing material. In addition, the plasma processing apparatus 1 performs a plasma processing process of plasma-processing the workpiece. In addition, the plasma processing apparatus 1 performs a separation process of separating the workpiece processed with plasma from the electrostatic chuck 20 attached with the N-containing material. As a result, the reaction product attached to the electrostatic chuck 20 is covered by the N-containing material together with the electrostatic chuck 20 and thereafter, the workpiece may be adsorbed by the electrostatic chuck 20. In other words, movement of electric charges between the wafer W adsorbed by the electrostatic chuck 20 and the reaction product attached to the electrostatic chuck 20 is blocked by the N-containing material. As a result, the residual adsorptive force that disturbs the separation of the wafer W from the electrostatic chuck 20 may be reduced.

The plasma processing apparatus 1 of the second embodiment attaches the N-containing material to the electrostatic chuck 20 attached with the reaction product containing C and F, during a period until the workpiece which is not plasma-processed is carried into the chamber 10, after the attached matter containing C and F which remains in the chamber 10 is removed by the plasma of the $O_2$-containing gas. As a result, after dry cleaning (DC) using the $O_2$-containing gas is performed, the reaction product attached to the electrostatic chuck 20 may be covered by the N-containing material together with the electrostatic chuck 20. Consequently, the residual adsorptive force generated by the DC using the $O_2$-containing gas may be reduced. Accordingly, since the plasma-processed substrate may be smoothly pinned up without a load, the workpiece may be carried out of the chamber without damaging the workpiece.

In the plasma processing apparatus 1 of the second embodiment, the processing time of the attachment process is a predetermined time or more. As a result, the residual adsorptive force that disturbs the separation of the wafer W from the electrostatic chuck 20 may be stably reduced.

The order of a wide range of a conditions in which the torque is reduced by attaching by plasma containing at least one of Ar, He, $O_2$ and $N_2$ is $N_2 > Ar(He) > O_2$. That is, $N_2$ is a more preferred gas.

Other Exemplary Embodiments

Hereinabove, the plasma processing method and the plasma processing apparatus according to the first and second embodiments have been described, but the disclosed technique is not limited thereto. Hereinafter, other embodiment will be described.

For example, in the aforementioned embodiment, the example in which the attachment process, the adsorption process, the plasma processing process, and the cleaning process are sequentially repeated has been described, but the present disclosure is not limited thereto. For example, after the attachment process is performed, whenever the workpiece which is not plasma-processed is carried into the chamber 10, the adsorption process, the plasma processing process, the separation process, and the cleaning process are performed, and when the number of performance times of the adsorption process, the plasma processing process, the separation process, and the cleaning process reaches a predetermined number of times, a series of processing of performing the attachment process again may be repeated. That is, before the workpiece which is not plasma-processed is carried into the chamber 10, the attachment process may not be performed every time. As a result, a throughput when the workpiece is plasma-processed may be improved.

In the aforementioned embodiment, an example in which the plasma processing apparatus 1 is a parallel flat plate type capacitively coupled plasma processing apparatus has been described, but the present disclosure is not limited thereto. For example, the plasma processing apparatus 1 may be applied even to a plasma processing apparatus using inductively coupled plasma (ICP) mounted with an electrostatic chuck, a plasma processing apparatus using radial line slot antenna (RLSA) plasma, and a plasma processing apparatus using magnetron plasma.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma processing method comprising:
   attaching a Si-containing material or a N-containing material to an electrostatic chuck that is provided in a processing container and attached with a reaction product containing C and F, in a state where a workpiece is not mounted on the electrostatic chuck;
   adsorbing the workpiece by the electrostatic chuck attached with the Si-containing material or the N-containing material when the workpiece is carried into the processing container;
   processing the workpiece with plasma; and
   separating the workpiece processed with plasma from the electrostatic chuck attached with the Si-containing material or the N-containing material.

2. The plasma processing method of claim 1, wherein in the attaching, the Si-containing material is attached to the electrostatic chuck attached with the reaction product containing C and F by generating plasma of processing gas containing at least any one of Ar, He, $O_2$, and $N_2$ and sputtering a member including Si by ions in the plasma, in a state where the workpiece is not mounted on the electrostatic chuck.

3. The plasma processing method of claim 2, further comprising:
   removing the reaction product remaining in the processing chamber and containing C and F attached to the electrostatic chuck by plasma of $O_2$-containing gas in a state where the workpiece is not mounted on the electrostatic chuck, after the workpiece is separated from the electrostatic chuck and carried out of the chamber.

4. The plasma processing method of claim 1, wherein in the attaching, the N-containing material is attached to the electrostatic chuck attached with the reaction product containing C and F by generating plasma of processing gas containing $N_2$, in a state where the workpiece is not mounted on the electrostatic chuck.

5. The plasma processing method of claim 4, wherein a high-frequency power used for generating the plasma of the processing gas containing $N_2$ is 400 W to 2,000 W.

6. The plasma processing method of claim 4, further comprising:
   removing the reaction product remaining in the processing chamber and containing C and F attached to the electrostatic chuck by plasma of $O_2$-containing gas in a state where the workpiece is not mounted on the electrostatic chuck, after the workpiece is separated from the electrostatic chuck and carried out of the chamber.

7. The plasma processing method of claim 1, further comprising:
   removing the reaction product remaining in the processing chamber and containing C and F attached to the electrostatic chuck by plasma of an $O_2$-containing gas, in a state where the workpiece is not mounted on the electrostatic chuck, after the workpiece is separated from the electrostatic chuck and carried out of the chamber.

8. The plasma processing method of claim 7, wherein whenever a workpiece that is not processed with plasma is carried into the processing container, the adsorbing, the processing, the separating, and the removing are performed.

9. The plasma processing method of claim 8, further comprising repeating a series of processes including re-performing the attaching when each of the adsorbing, the processing, the separating, and the removing is performed a predetermined number of times.

10. The plasma processing method of claim 7, wherein, in the attaching, the Si-containing material or the N-containing material is attached to the electrostatic chuck during a period of time before a workpiece that is not processed with plasma is carried into the chamber, and wherein said period of time is after the reaction product containing C and F attached to the electrostatic chuck is removed.

11. The plasma processing method of claim 1, wherein a processing time of the attaching is a predetermined time or more.

12. The plasma processing method of claim 1, wherein the processing time of the attaching is 5 seconds to 60 seconds.

13. The plasma processing method of claim 1, wherein an internal pressure of the processing container is maintained in a range of 6.67 Pa to 107 Pa when the attaching is performed.

14. A plasma processing apparatus comprising:
   a processing container configured to process a workpiece with plasma;
   an electrostatic chuck disposed in the processing container and configured to adsorb the workpiece;
   an exhaust unit configured to decompress an atmosphere in the processing container;
   a gas supplying unit configured to supply a processing gas to the processing container; and
   a control unit configured to control a series of processes including attaching a Si-containing material or a N-containing material to an electrostatic chuck attached with a reaction product containing C and F, in a state where a workpiece is not mounted on the electrostatic chuck, adsorbing the workpiece by the electrostatic chuck attached with the Si-containing material or the N-containing material when the workpiece is carried into the processing container, processing the workpiece with plasma, and separating the workpiece processed with plasma from the electrostatic chuck attached with the Si-containing material or the N-containing material.

* * * * *